United States Patent [19]
Ryan et al.

[11] Patent Number: 5,903,509
[45] Date of Patent: May 11, 1999

[54] MEMORY DEVICE WITH MULTIPLE INTERNAL BANKS AND STAGGERED COMMAND EXECUTION

[75] Inventors: Kevin J. Ryan, Meridian; Jeffrey P. Wright, Boise, both of Id.

[73] Assignee: Micron Technology, Inc., Boise, Id.

[21] Appl. No.: 09/072,876

[22] Filed: May 4, 1998

Related U.S. Application Data

[63] Continuation of application No. 08/581,034, Dec. 29, 1995, Pat. No. 5,748,551.

[51] Int. Cl.$^6$ ........................................................ G11C 8/00
[52] U.S. Cl. ........................................ 365/230.03; 365/233
[58] Field of Search ........................ 365/230.03, 230.06, 365/230.08, 233, 189.05, 203

[56] References Cited

U.S. PATENT DOCUMENTS

| | | | |
|---|---|---|---|
| 4,951,246 | 8/1990 | Fromm et al. | 364/900 |
| 5,036,494 | 7/1991 | Wise et al. | 365/230.03 |
| 5,222,047 | 6/1993 | Matsuda et al. | 365/230.03 |
| 5,506,810 | 4/1996 | Runas | 365/230.03 |
| 5,598,372 | 1/1997 | Matsumoto et al. | 365/230.03 |
| 5,721,860 | 2/1998 | Stolt et al. | 365/233 |
| 5,748,551 | 5/1998 | Ryan et al. | 365/230.03 |

FOREIGN PATENT DOCUMENTS

| | | |
|---|---|---|
| 0 303 811 A1 | 2/1989 | European Pat. Off. . |
| 36 44 322 A1 | 7/1988 | Germany . |
| WO 94/29870 | 12/1994 | WIPO . |

*Primary Examiner*—David Nelms
*Assistant Examiner*—Trong Phan
*Attorney, Agent, or Firm*—Seed & Berry LLP

[57] ABSTRACT

In a memory device such as a page-oriented synchronous dynamic random access memory device (SDRAM), a memory array and associated circuitry are divided into multiple internally defined circuit banks. Commands and addresses applied to the memory device affect all internal banks identically, but on a time-staggered basis. In an eight bank embodiment, activation of a selected row is first initiated in Bank0 by registration of an ACTIVE command and a coincident row address. One system clock cycle later, activation of the selected row is initiated in Bank1, and so on until activation of the selected row is initiated in Bank7 seven clock cycles after the initial registration of the command. A READ or WRITE command and coincident column address can be applied after the activation time limit has been met for the selected row in Bank0. The READ or WRITE command then affects successive banks in the above-described time staggered manner. Similarly, a PRE-CHARGE command can be applied when the read latency or write recovery time limit has been met for Bank0, and this command is executed in a time staggered manner in the successive banks. In a four bank embodiment, command registration and execution is staggered every two successive system clock cycles.

26 Claims, 19 Drawing Sheets

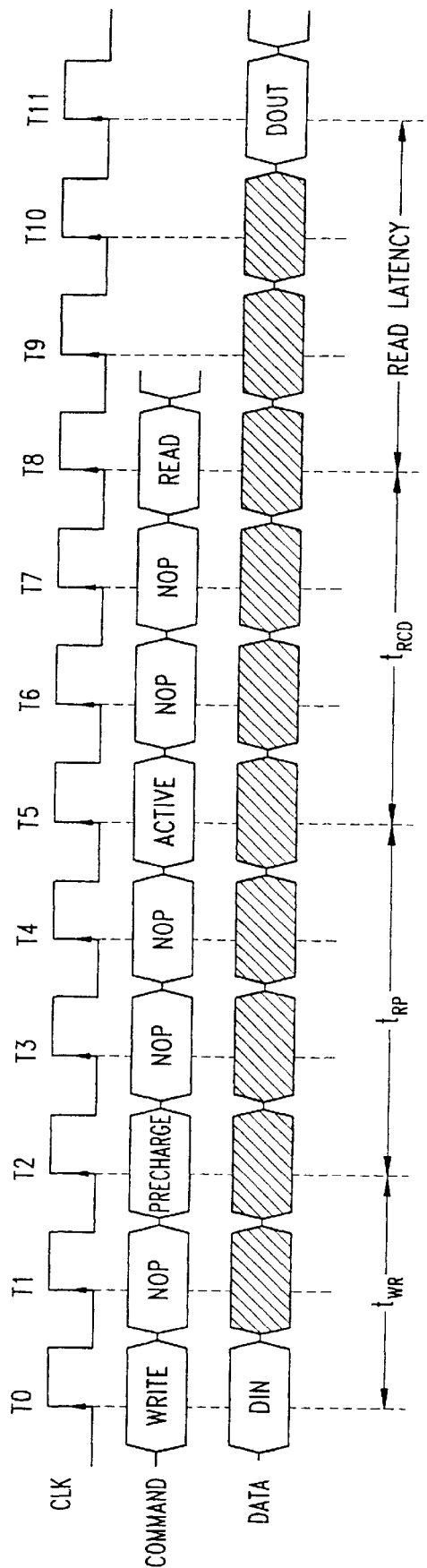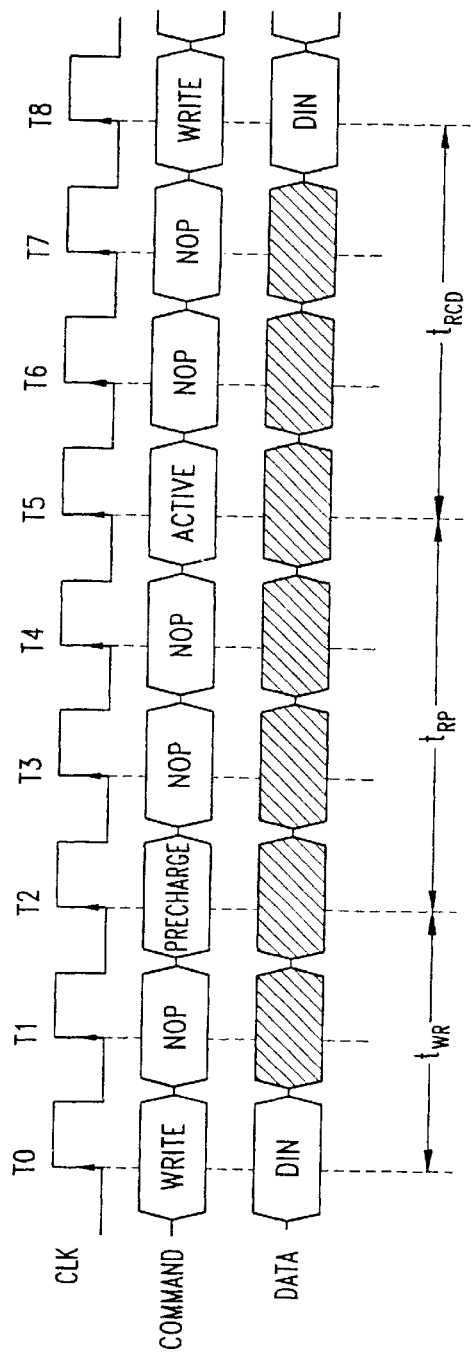
Fig. 5
(Prior Art)
Fig. 6
(Prior Art)

MEMORY DEVICE WITH MULTIPLE INTERNAL BANKS AND STAGGERED COMMAND EXECUTION

CROSS-REFERENCE TO RELATED APPLICATION

This application is a continuation of U.S. patent application Ser. No. 08/581,034, filed Dec. 29, 1995, which is U.S. Pat. No. 5,748,551.

TECHNICAL FIELD

This invention relates generally to electronic devices, and more particularly to memory devices and methods for transferring data to and from such memory devices.

BACKGROUND OF THE INVENTION

Computer designers are always searching for faster memory devices that will allow them to design faster computers. A significant limitation on a computer's operating speed is the time required to transfer data between a processor and a memory circuit, such as a read or write data transfer. Memory circuits, such as a dynamic random access memories (DRAMs), usually include a large number of memory cells arranged in one or more arrays, each having rows and columns. The memory cells provide locations at which the processor can store and retrieve data. The more quickly the processor can access the data within the memory cells, the more quickly it can perform a calculation or execute a program using the data.

FIG. 1 shows, in part, a typical computer architecture. A central processing unit (CPU) or processor 50 is connected to a bus 52, which in turn is connected to a system or memory controller 54 and a datapath integrated circuit (IC) 56. The memory controller 54 and the datapath IC 56 serve as interface circuitry between the processor 50 and a memory device 60. The processor issues a command C and an address A which are received and translated by the memory controller 54, which in turn applies command signals and an address to the memory device 60. Corresponding to the processor-issued commands C and addresses A, data D is transferred between the processor 50 and the memory device 60 via the datapath IC 56.

Illustrative of the type of memory devices 60 currently used, is a synchronous dynamic random access memory (SDRAM) device 100 shown as a block diagram in FIG. 2. The memory device 100 includes as its central memory element two memory array banks 101A and 101B, which operate under the control of a control logic circuit 102. Each of the memory arrays 101A & B includes a plurality of memory cells (not shown) arranged in rows and columns. For purposes of discussion, the memory device 100 has an 8-bit word width—meaning that to each specified memory address (combined bank, row and column address) there is a one-to-one correspondence with 8 memory cells in one of the arrays 101A & B, and the processor 50 (see FIG. 1) operates on data elements of 8 bits each.

A system clock (not shown) provides a signal CLK to the control circuit 102 of the memory device 100, as well as to the processor 50 and controller 54 (see FIG. 1) accessing the memory device. Command signals input to the control circuit 102 are decoded by command decode circuitry 104. These signals are well known in the art, and include signals such as $\overline{RAS}$ (row address strobe), $\overline{CAS}$ (column address strobe) and $\overline{WE}$ (write enable). Distinct combinations of the various command signals constitute distinct commands. For example, the combination of $\overline{RAS}$ low, $\overline{CAS}$ high and $\overline{WE}$ low can represent a PRECHARGE command. Examples of other well known commands include ACTIVE, READ, WRITE and NOP. Corresponding to the applied command, the control circuit 102 sends control signals on control lines 103A–H to other parts of the memory device 100, controlling the timing of access to the memory cells in arrays 101A and 101B.

An address is input to an address register 106, indicating the memory location to be accessed. The address specifies one of the memory banks 101A & B and a row and column address within the specified bank. The address register 106 provides the address information to the control circuit 102, and to a row-address mux 107 and a column-address latch and decode circuit 110. The row-address mux 107 multiplexes the row address information and provides it to one of row-address latch and decode circuits 108A and 108B corresponding to the one of the memory banks 101 A & B to be accessed. Each of the row latch and decode circuits 108A and 108B takes a row address provided by the row-address latch 107 and activates a selected row of memory cells (not shown) in the memory array 101A and 101B by selecting one of several row access lines 112A and 112B, all respectively. The column latch and decode circuit 110 takes a column address provided by the address register 106 and selects one of several column access lines 114A and 114B, each of which is coupled to one of the memory arrays 101A and 101B by one of I/O interface circuits 116A and 116B, all respectively. Each of the I/O interface circuits 116A & B selects the memory cell(s) corresponding to the column location in an activated row. The I/O interface circuits 116 include sense amplifiers which determine and amplify the logic state of the selected memory cells, and I/O gating of data to and from a data I/O register 118. The data register 118 is connected to a data bus which is used to input and output data to and from the memory device 100.

Data transfer cycles typically involve several steps and each step takes time. For example, a read access requires the control logic circuit 102 of the memory device 100 to decode commands and the memory cell address; and to provide control signals to the circuitry accessing the memory array banks 101A and 101B in order to activate the selected row in the selected memory bank, allow time for sense amplifiers to develop signals from the selected column in the memory bank, transfer data from these sense amplifiers to the data register 118 where the data is then made available on the data bus, and terminate the cycle by precharging the row for subsequent access. Steps that are particularly time consuming include the activation step, the read latency (the time between registration in the memory device of a read command and the availability of the accessed data on the data bus), and the precharge step.

In applications involving a continuous flow of data such as Graphics, Video and Communications, a page-oriented memory device is desirable because it can reduce the number of activation and precharge steps performed. When a memory device is operated in a page mode cycle, a row is activated, and data transfers occur, at a large number (sometimes all) of the columns in that row before completion of the cycle with a row precharge step. This contrasts with the conventional data transfer cycle where a single column is accessed in the activated row, the row is then precharged, and the next data transfer cycle is initiated with a new set of activation and precharge steps.

When access is sought to a row other than one currently open in the page-oriented memory device (sometimes referred to as a "page miss" in the art), a new page mode cycle is initiated, complete with activation and precharge steps. Thus, a page-oriented memory device allows a continuous flow of data to and from one row, but interrupts that data flow during the time required to shut down the one row and access the other row.

One way of partly eliminating the interrupted data flow associated with a page miss is to define multiple memory cell array banks, as shown in the memory device 100 of FIG. 2. For example, when a series of accesses to Row I (not shown) in Bank 101A is performed and subsequent access to Row J (not shown) in Bank 101B is required, the activation step can be initiated in Bank 101B while access is continuing in Bank 101A. If initiation of access to Row J in Bank 101B occurs early enough, the time delay associated with the precharge of Row I in Bank 101A, activation of Row J in Bank 101B, and read latency (if applicable) can be hidden—meaning that there is no interruption in the flow of data due to the change of rows.

The currently used multiple bank approach is, however, of no benefit if the Row I currently being accessed and the Row J subsequently to be accessed are in the same one of Banks 101 A & B. In this case the data bus is idle for the entire precharge time of Row I and the activation time and read latency (if applicable) of Row J. FIGS. 3–6 illustrate this disruption of the data flow associated with a page miss.

Each of FIGS. 3–6 shows the clock signal CLK with leading edges occurring at T0, T1, T2, etc.; the commands supplied to the memory device 100 and registered therein at times corresponding to leading edges of the clock signal; and the state of the data bus on which data is output (DOUT) from or input (DIN) to the memory device at a time corresponding to a leading edge of the clock signal. The FIGS. 3–6 are representative of the current state of the art: corresponding to a selected clock speed of 100 MHz, the precharge time 'RP is of duration 3 clock cycles (i.e., 30 ns), the activation time 'RCD is 3 clock cycles, the read latency is 3 clock cycles, and the write recovery time 'WR (the time between registration in the memory device of input data DIN and the availability of the write-accessed row for the row-deactivating precharge step) is 2 clock cycles.

FIG. 3 shows a read access to one row being terminated by registration and execution in the memory device 100 of a PRECHARGE command, and the subsequent activation of another row by an ACTIVE command, followed by a READ command. The data bus is idle for 7 clock cycles between the last availability of data DOUT from the one row and the first availability of data DOUT from the other row. FIG. 4 shows a read access to one row being terminated by a PRECHARGE command, and the subsequent activation of another row by an ACTIVE command, followed by a WRITE command. The data bus is idle for 4 clock cycles between the last availability of data DOUT from the one row and the first availability of data DIN for the other row. Most dramatic is the transition from a write access in one row followed by a read access in another row, as shown in FIG. 5. In this case, the data bus is idle for 10 full clock cycles. FIG. 6 shows the data bus idling for 7 clock cycles during a transition from a write access in one row to a write access in another row.

In addition to not completely solving the problem of excessive data bus idle time for successive page miss accesses, the currently used multiple bank approach has a number of drawbacks. The memory controller 54 (see FIG. 1) is made more complicated, because it must keep track of which rows are open in what banks. Alternatively, the memory controller 54 could always close a row after accessing it, but this then eliminates the possibility of a "page hit" if subsequent access is to that same row. Additionally, a means for independently addressing the multiple banks and providing independent commands to multiple banks at appropriate times further complicates the control circuit 102 and other circuitry internal to the memory device 100 (see FIG. 2).

SUMMARY OF THE INVENTION

According to the present invention, a memory device has an array of memory cells arranged in a plurality of subarrays, with each subarray having the memory cells arranged in rows and columns. Commands applied to the memory device affect all subarrays identically, but on a time-staggered basis provided for internal to the memory device. Command execution is initiated in a first of the subarrays, and a predetermined time later in a second of the subarrays, and so on until command execution is initiated in a last of the subarrays. After completed execution of a command in the first subarray, a subsequent command in a data transfer operation can be applied to the memory device, before completed execution of earlier commands in other subarrays. Thus, data transfer operations to and from the memory device can be executed continuously.

The memory device includes a plurality of control circuits, each coupled to a corresponding one of the subarrays. Each control circuit selects in the corresponding subarray a first memory cell identified by a row and column address provided on an address bus. The first memory cell in a first of the subarrays is selected at a first time, and the first memory cell in each of other subarrays is selected after a respective time interval (which may be an integer multiple of system clock cycle periods) following the first time, until the first memory cell in a last of the subarrays has been selected. Data is transferred between a data bus and the first memory cell in the first of the subarrays at a second time, and data is transferred between the data bus and the first memory cell in each of the other subarrays after the respective time interval following the second time.

Each control circuit also selects in the corresponding subarray a second memory cell identified by a second combined row and column address provided on the address bus. The second memory cell in the first of the subarrays is selected at a third time, and the second memory cell in each of the other subarrays is selected after the respective time interval following the third time. Selecting the second memory cell in the first subarray can be initiated at a time before completion of data transfer between the data bus and the first memory cell in the last of the subarrays. Data is transferred between a data bus and the second memory cell in the first of the subarrays at a fourth time, and data is transferred between the data bus and the second memory cell in each of the other subarrays after the respective time interval following the fourth time. Because of the staggered command registration and execution, a data transfer involving the second memory cell in the first of the subarrays can immediately follow the data transfer involving the first memory cell in the last of the subarrays.

BRIEF DESCRIPTION OF THE DRAWINGS

FIG. 5 is a timing diagram showing a transition from a write access in one row of the memory array to a read access in another row of the memory array in the prior art memory device of FIG. 1.

FIG. 6 is a timing diagram showing a transition from a write access in one row of the memory array to a write access in another row of the memory array in the prior art memory device of FIG. 1.

DETAILED DESCRIPTION OF THE PREFERRED EMBODIMENT

Figure 7:
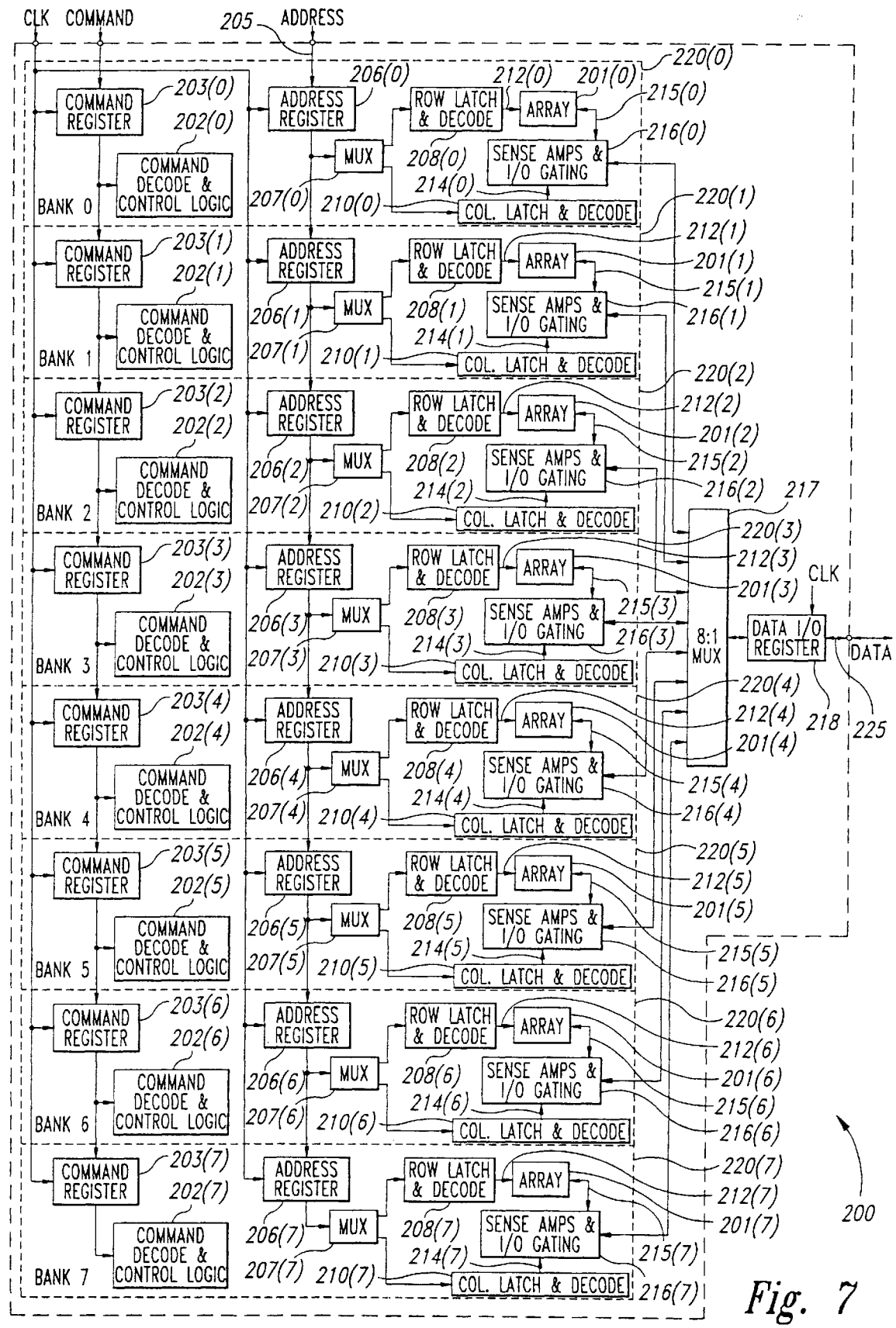
FIG. 7 is a block diagram of a memory device according to the present invention.

FIG. 7 is a block diagram of a memory device 200 according to the present invention. In one embodiment of the invention, the memory device 200 is a synchronous dynamic random access memory (SDRAM). The memory device 200 has as its central memory element a memory array 201 (collectively 201(0)–201(7) in FIG. 7), which includes a plurality of memory cells (not shown) arranged in rows and columns. The memory array 201 is divided into eight memory subarrays 201(0)–201(7), which form part of eight defined circuit banks 220(0)–220(7). The subarray definition is internal to the memory device 200, and the memory device appears externally to be a single bank device—meaning that the memory device is addressable solely with a row and column address. Commands applied to the memory device 200 affect all the internal banks 220(0)–220(7) in the same manner, but not simultaneously, as explained below and as depicted in FIGS. 8–16. In one embodiment of the invention, the memory device 200 has an 8-bit word width—meaning that to each specified memory address (paired row and column address) there is a one-to-one correspondence with 8 memory cells in each of the subarrays 201(0)–201(7), and a processor (not shown) operates on data elements of 8 bits each.

A single representative bank 220(i) (i=0, 1, . . . , 6 or 7) will now be described. A system clock (not shown) provides a signal CLK to control circuitry in the bank 220(i), as well as to the processor and/or other addressing circuitry (such as a memory controller) accessing the memory device 200. The control circuitry includes a command register 203(i) and a command decode and control logic circuit 202(i). Command signals applied to the memory device 200 are registered in the command register 203(i) and decoded by the decode and control circuit 202(i). These command signals are well known in the art, and include signals such as $\overline{RAS}$ (row address strobe), $\overline{CAS}$ (column address strobe) and $\overline{WE}$ (write enable). Distinct combinations of the various command signals constitute distinct commands. For example, the combination of $\overline{RAS}$ low, $\overline{CAS}$ high and $\overline{WE}$ low can represent a PRECHARGE command. Examples of other commands include ACTIVE, READ, WRITE and NOP. Corresponding to the applied command, the control circuit 202(i) sends control signals on control lines (not shown) to other parts of the bank 220(i), controlling the timing of access to the memory cells in the subarray 201(i).

An address is applied to the memory device 200 on an address bus 205 and registered in an address register 206(i). The address includes a row address and a column address, which are preferably applied to the memory device 200 sequentially. The address register 206(i) then sequentially provides the row and column addresses to an address mux 207(i), which in turn provides the row address to a row-address latch and decode circuit 208(i) and the column address to a column-address latch and decode circuit 210(i).

In response to one or more control signals (not shown) provided by the control circuit 202(i), the row latch and decode circuit 208(i) takes a row address and activates a corresponding row of memory cells (not shown) in the subarray 201(i) by selecting one of several row access lines 212(i). The row latch and decode circuit 208(i) also operates to deactivate or precharge the activated row in response to one or more control signals (not shown) provided by the control circuit 202(i).

In response to one or more control signals (not shown) provided by the control circuit 202(i), the column latch and decode circuit 210(i) takes a column address and selects a corresponding one of several column access lines 214(i), each of which is coupled to the subarray 201(i) by an I/O interface circuit 216(i). In response to one or more control signals (not shown) provided by the control circuit 202(i), the I/O interface circuit 216(i) selects the memory cell(s) corresponding to the column location in an activated row via bit lines 215(i). The I/O interface circuit 216(i) includes sense amplifiers which determine and amplify the logic state of each of the selected memory cells, and I/O gating of the accessed data to and from a data I/O register 218 via an intermediate mux 217.

The intermediate mux circuit 217 multiplexes the data transferred from/to the eight internal banks 220(0)–220(7) and provides/receives the data elements to/from the data register 218. The data register 218 is connected to a data bus 225 and is used to input and output data to and from the memory device 200, responsive to the system clock signal CLK.

Figure 8:
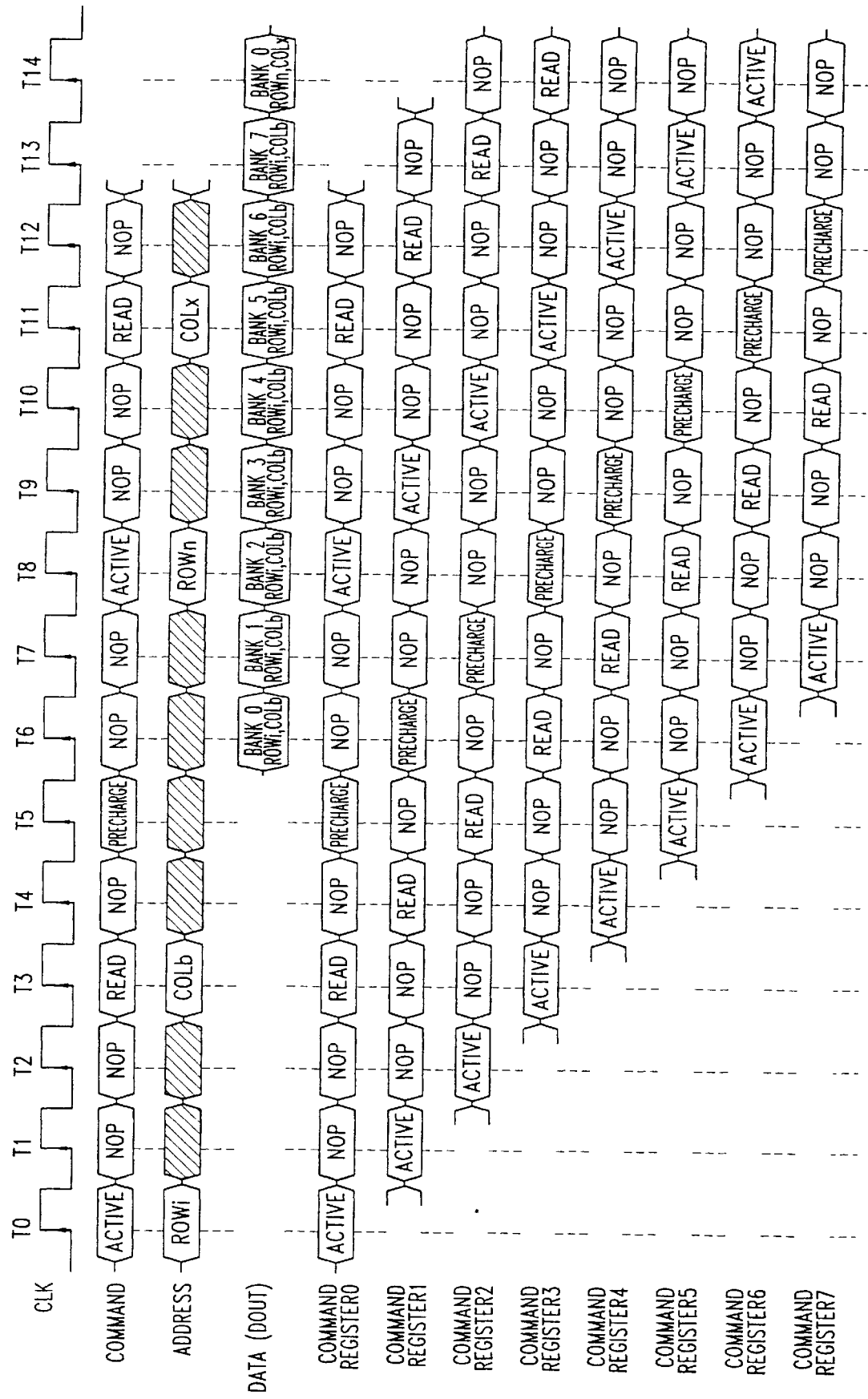
FIG. 8 is a timing diagram showing a time-staggered registration of applied commands in command registers of the memory device of FIG. 7.
Figure 9:
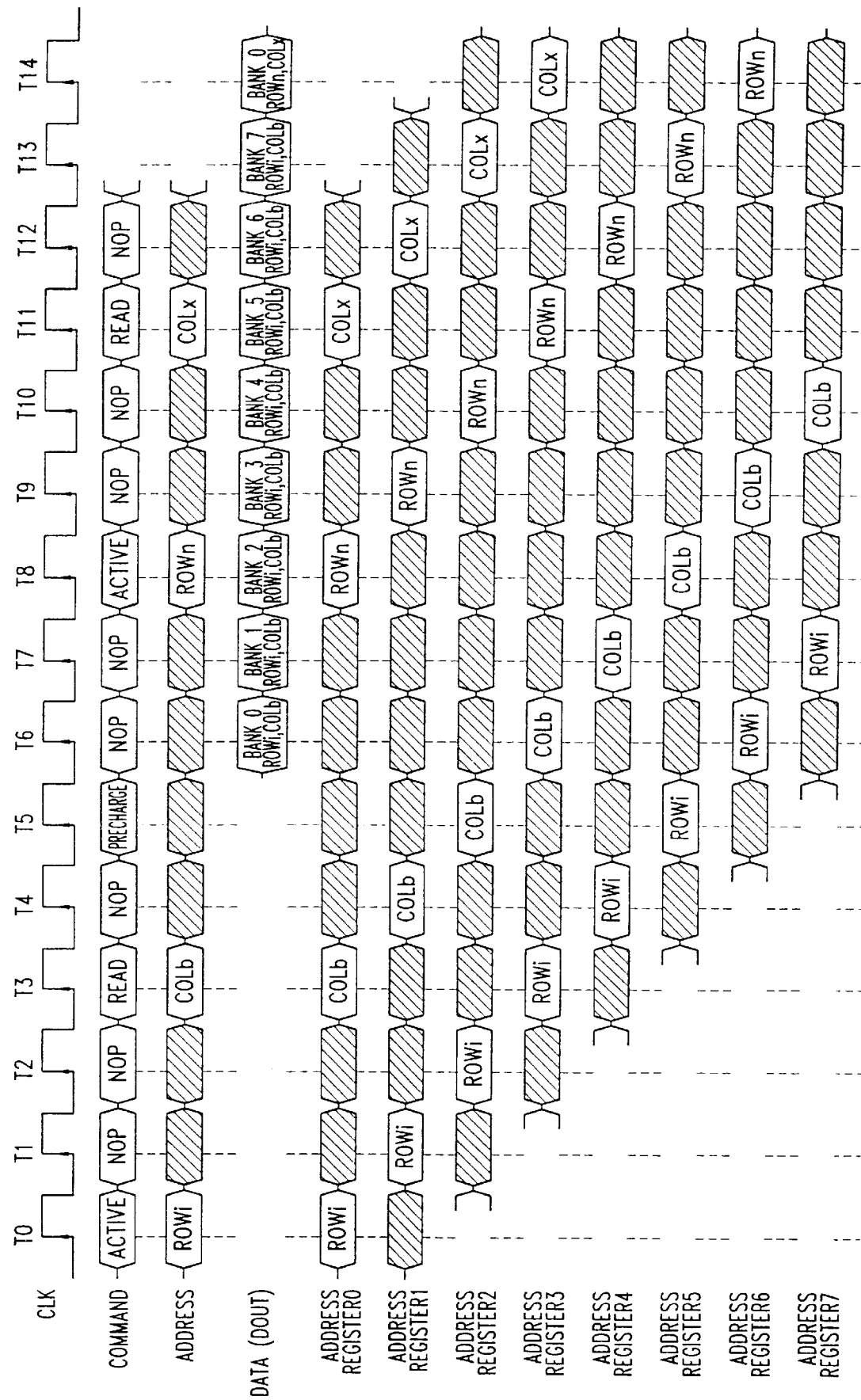
FIG. 9 is a timing diagram showing a time-staggered registration of applied addresses in address registers of the memory device of FIG. 7.

FIGS. 8 and 9 are timing diagrams showing a read access in one row followed by a read address in another row of each of the eight memory subarrays 201(0)–201(7) of FIG. 7. FIGS. 8 and 9 show the clock signal CLK with leading edges occurring at times T0, T1, T2, etc.; the command supplied to the memory device 200 and registered therein at a time corresponding to a leading edge of the clock signal; row and column addresses provided to the memory device on the address bus 205 and registered in the memory device at times corresponding to leading edges of the clock signal; and the state of the data bus 225 on which data is output (DOUT) from the memory device at a time corresponding to a leading edge of the clock signal. FIG. 8 shows the successive registration of each command in the command registers 203(0)–203(7) (identified as COMMAND REGISTER0–COMMAND REGISTER7 in FIG. 8) of the memory device 200. FIG. 9 shows the successive registration of the row and column addresses in the address registers 206(0)–206(7) (identified as ADDRESS REGISTER0–ADDRESS REGISTER7 in FIG. 9).

Referring to FIGS. 7, 8 and 9, the time-staggered operation of the memory device 200 according to the present invention will now be described. An ACTIVE command is supplied by external circuitry, such as a system or memory controller, for registration in the memory device 200 at time T0. This ACTIVE command is registered in command register 203(0) of bank 220(0) at time T0. Command register 203(0) then provides this ACTIVE command for registration in command register 203(1) of bank 220(1) at time T1. In turn, command register 203(1) provides the ACTIVE command for registration in command register 203(2) of bank 220(2) at time T2, and so on. Also, a first row address ROWi is provided to the memory device 200 for registration therein at time T0. This row address is registered in address register 206(0) of bank 220(0) at time T0. The address register 206(0) then provides the row address ROWi to address register 206(1) of bank 220(1) for registration therein at time T1, and so on. Thus, the ACTIVE command and coincident row address ROWi are registered in the banks 220(0)–220(7) in succession at regular time intervals, and activation of the addressed row in each of the subarrays 201(0)–201(7) occurs in a time-staggered manner.

FIGS. 8 and 9 also depict the registration of the READ command and the coinciding column address COLb in the memory device 200 at time T3, and the successive registration of this command and address information in the internal banks 220(0)–220(7) (identified as BANK 0–BANK 7 in FIGS. 8 and 9). FIG. 8 further depicts the registration of a PRECHARGE command in the memory device 200, and the resulting time-staggered registration of this command in the internal banks 220(0)–220(7). As further shown in FIGS. 8 and 9, a second read access occurs, complete with the time-staggered registration of ACTIVE and READ commands, and row address ROWn and column address COLx. Because of the time-staggered registration of commands and addresses in the internal banks 220(0)–220(7) of the memory device 200, output data DOUT is made available in successive clock cycles, beginning with data retrieved from bank 220(0) at time T6. Data retrieved from the other internal banks 220(1)–220(7) is output successively thereafter until data retrieved from bank 220(7) is output at time T13. Because of the time-staggered registration of commands and address information, data retrieved from the second accessed memory location (ROWn, COLx) in the array 201(0) of the bank 220(0) is made available on the data bus at time T14, immediately following the output of data retrieved from the first accessed memory location (ROWi, COLb) in the array 201(7) of the bank 220(7).

FIGS. 10–16 show the clock signal CLK with leading edges occurring at times T0, T1, T2, etc.; the command supplied to the memory device 200 and registered therein at a time corresponding to a leading edge of the clock signal; and the state of the data bus 225 (see FIG. 7) on which data is output (DOUT) from or input (DIN) to the memory device at a time corresponding to a leading edge of the clock signal. The represented parameters in FIGS. 10–15, as in FIGS. 8 and 9, are the same as in FIGS. 3–6—namely, a clock speed of 100 MHz, a precharge time 'RP of 3 clock cycles, an activation time 'RCD of 3 clock cycles, a write recovery time 'WR of 2 clock cycles, and a read latency of 3 clock cycles—whereas the parameter values depicted in FIG. 16 correspond to a lower system clock speed, as described below. In each of FIGS. 10–16, information pertaining to banks 220(0)–220(7) of FIG. 7 is identified by reference to BANK 0–BANK 7, respectively.

Figure 10:
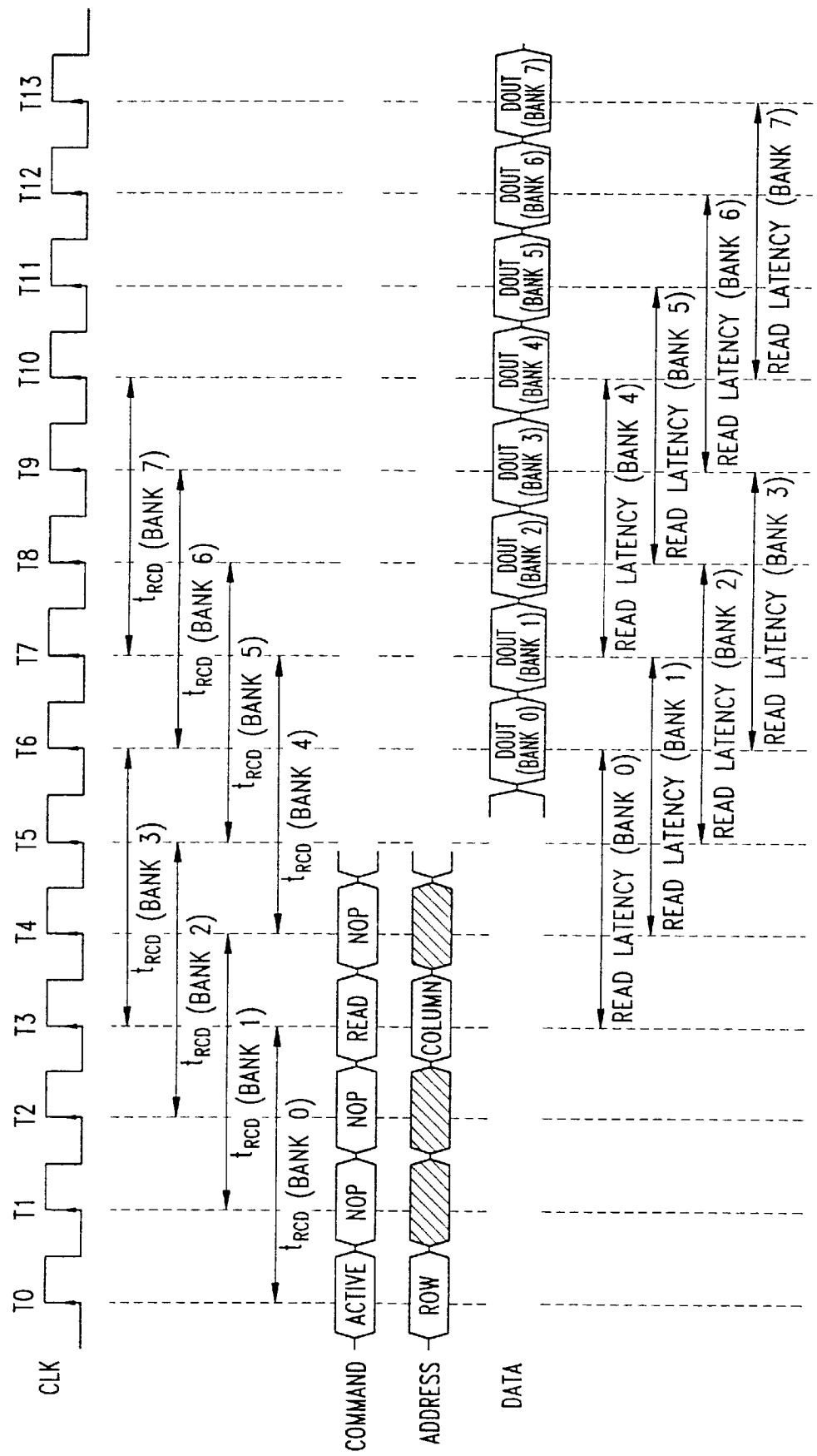
FIG. 10 is a timing diagram showing an activation of a row of a memory array in the memory device of FIG. 7, followed by a read access in the activated row.

FIG. 10 also shows the ROW and COLUMN addresses provided to the memory device 200 on the address bus 205 (see FIG. 7) and registered in the memory device at times corresponding to leading edges of the clock signal CLK. An ACTIVE command and a coincident ROW address are applied to initiate activation of a row at time T0. A row is then activated in each of the eight banks 220(0)–220(7) of FIG. 7 on a time-staggered basis, as described above. Registration of the ACTIVE command at time T0 initiates the activation of the addressed row in BANK 0. Activation of the row with the same address is initiated in BANK 1 one clock cycle later, and so on until activation of the row with the same address is initiated in BANK 7 at clock time T7.

As further shown in FIG. 10, a READ command can be registered in the memory device 200 after the activation time limit 'RCD is met for BANK 0 at clock time T3. In other words, the activation time limitation of the memory device 200 appears externally to be just the activation time limitation for BANK 0. A COLUMN address is provided coincident with the READ command. The first access is initiated in BANK 0 at clock time T3 (with column address latch and memory cell selection and sensing occurring soon thereafter), and then on the next clock cycle access to BANK 1 is initiated at clock time T4. This continues until access to eight data elements (each element having eight bits) has been initiated, on eight successive clock cycles, all from the single memory address (ROW-COLUMN combination). Following the respective read latency periods, each of the accessed data elements is then made available on the data bus 225 of FIG. 7 in eight successive clock cycles, beginning with the data element DOUT accessed from BANK 0 at clock time T6.

Figure 11:
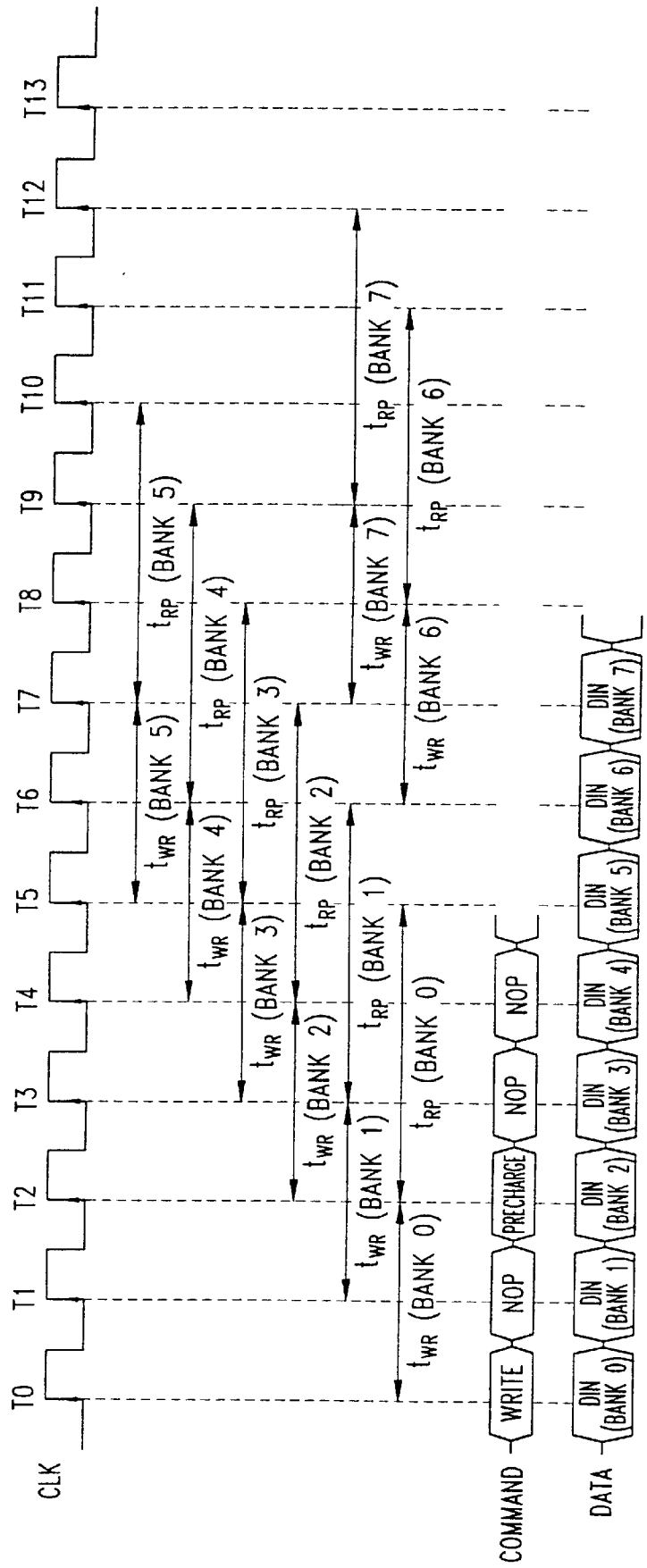
FIG. 11 is a timing diagram showing a write access to a row followed by a command to precharge the row of the memory array in the memory device of FIG. 7.

Similarly, when a PRECHARGE command is registered in the memory device 200, the activated row in each of the banks 220(0)–220(7) of FIG. 7 is deactivated on a staggered basis. FIG. 11 shows a WRITE command as the final access in a row followed by a PRECHARGE command. The write access is to BANK 0 at time T0, and data DIN to be stored in BANK 0 is input to the memory device 200 on the data bus 225 (see FIG. 7). In successive clock cycles, the writing of other data occurs in the other banks. Following the write recovery period 'WR of BANK 0, the memory device 200 can register the PRECHARGE command and deactivate the accessed row in BANK 0. In other words, the write recovery time limitation of the memory device 200 appears externally to be just the write recovery time limitation for BANK 0. In successive clock cycles, the write accessed rows in the other banks (BANK 1–BANK 7) are each deactivated following the corresponding write recovery periods in those banks.

The result of the staggered or pipe-lined row activation and precharge timing illustrated in FIGS. 10 and 11 is that activation of a subsequently accessed row in the memory subarrays 201(0)–201(7) (see FIG. 7) can be overlapped with the precharge of the currently accessed row. This occurs regardless of the specific row addresses of the currently and subsequently accessed rows, and thereby reduces the idle time on the data bus experienced in currently used memory devices.

Figure 1:
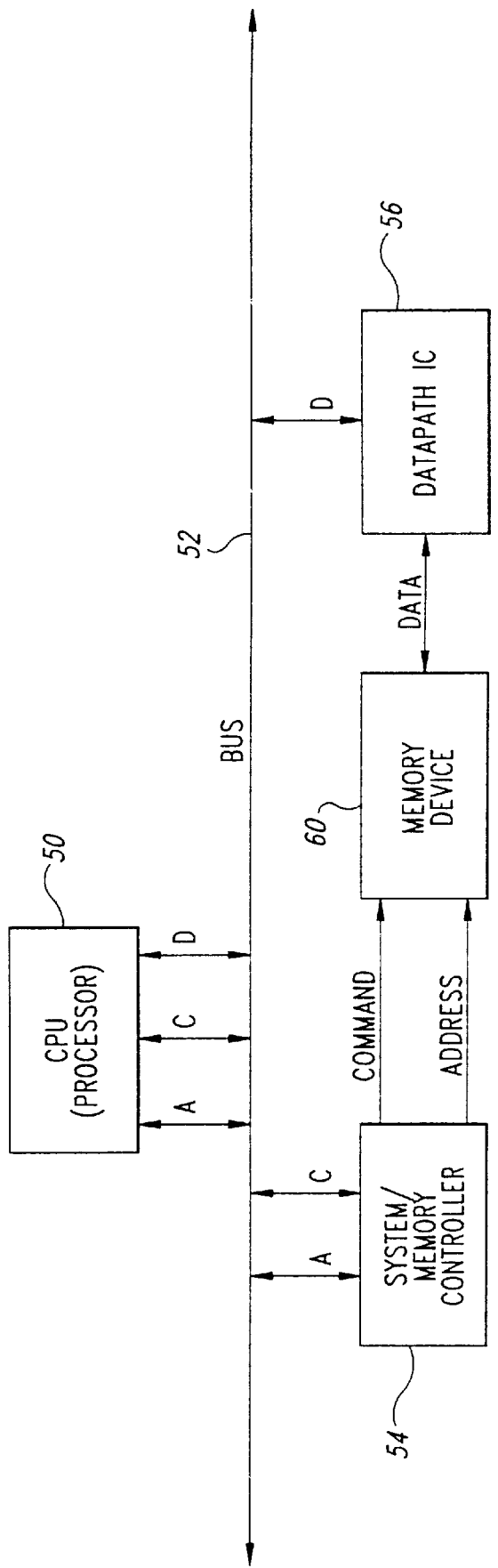
FIG. 1 is a block diagram of a prior art computer architecture.
Figure 2:
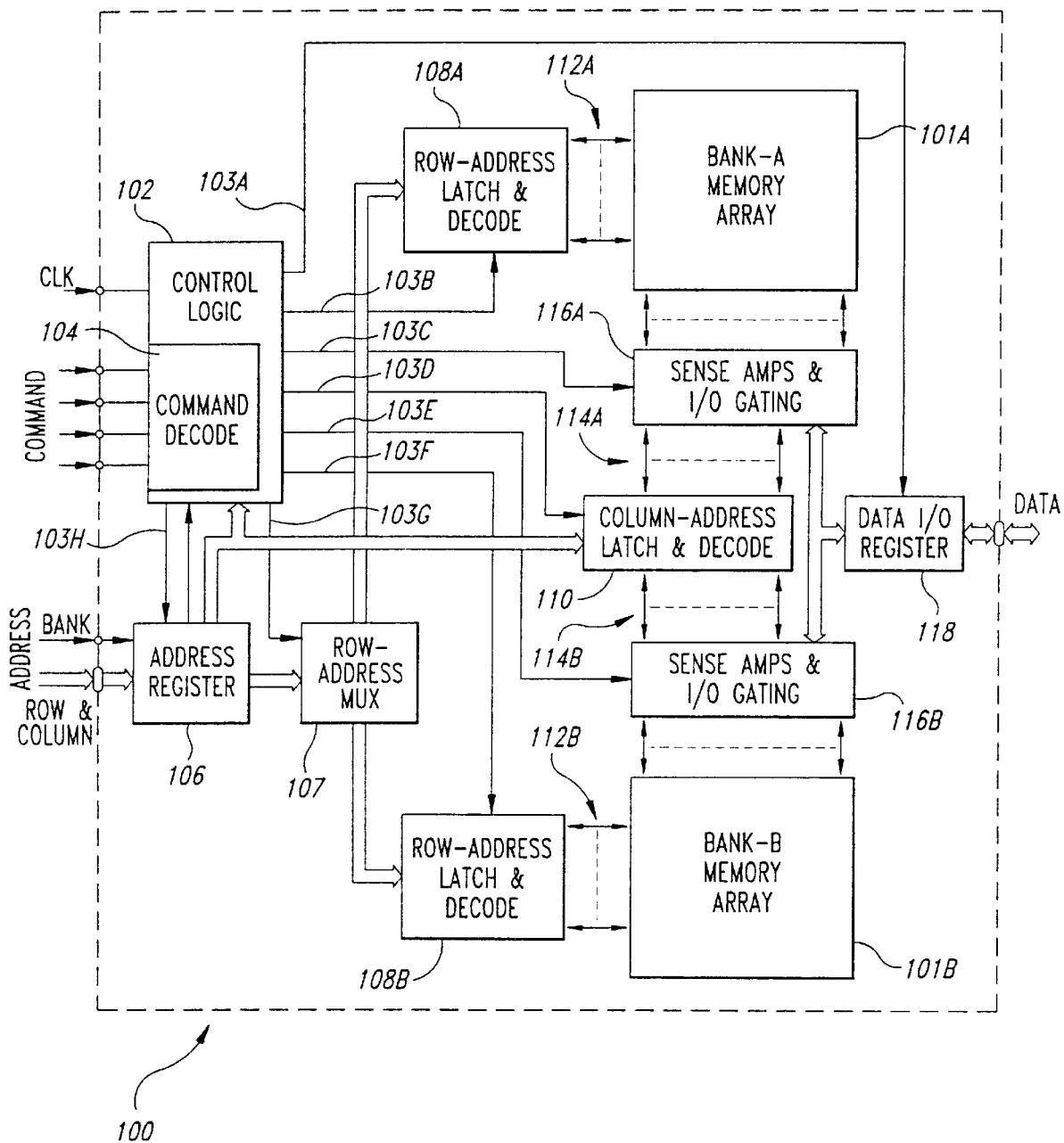
FIG. 2 is a block diagram of a prior art memory device.
Figure 3:
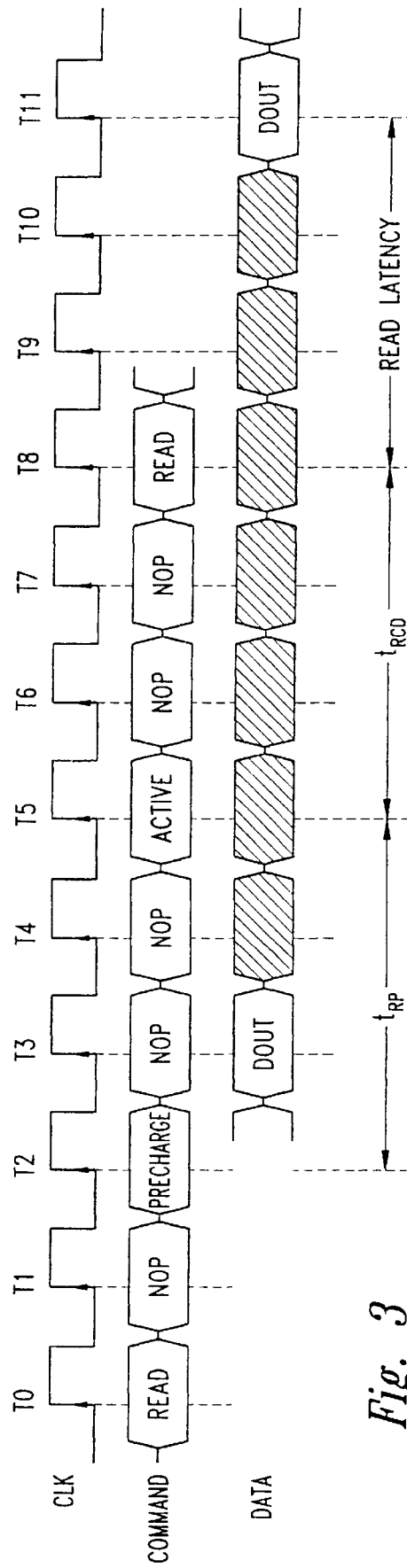
FIG. 3 is a timing diagram showing a transition from a read access in one row of a memory array to a read access in another row of the memory array in the prior art memory device of FIG. 1.
Figure 4:
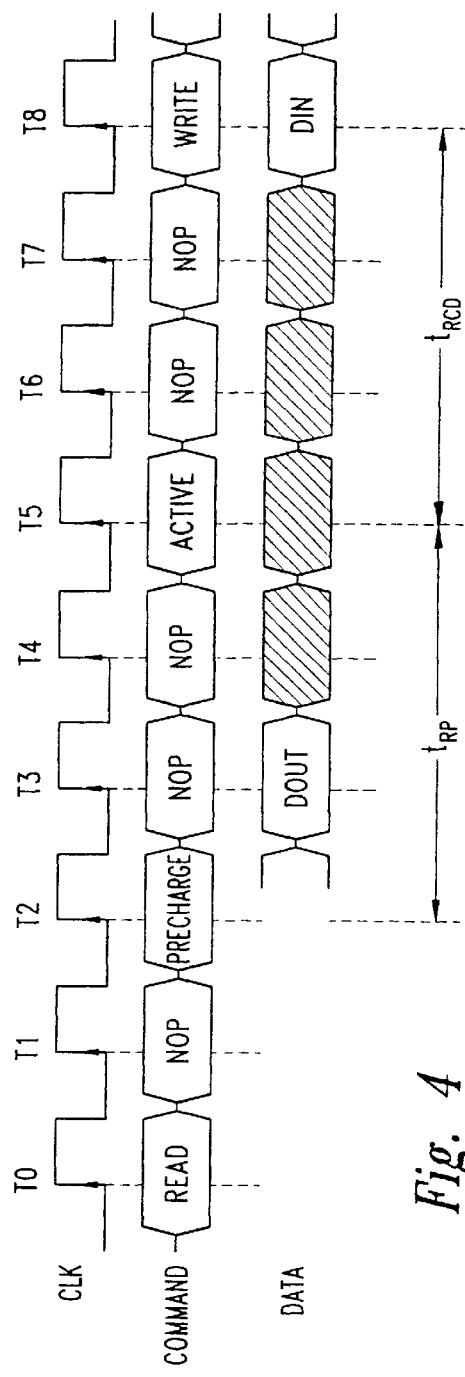
FIG. 4 is a timing diagram showing a transition from a read access in one row of the memory array to a write access in another row of the memory array in the prior art memory device of FIG. 1.
Figure 12:
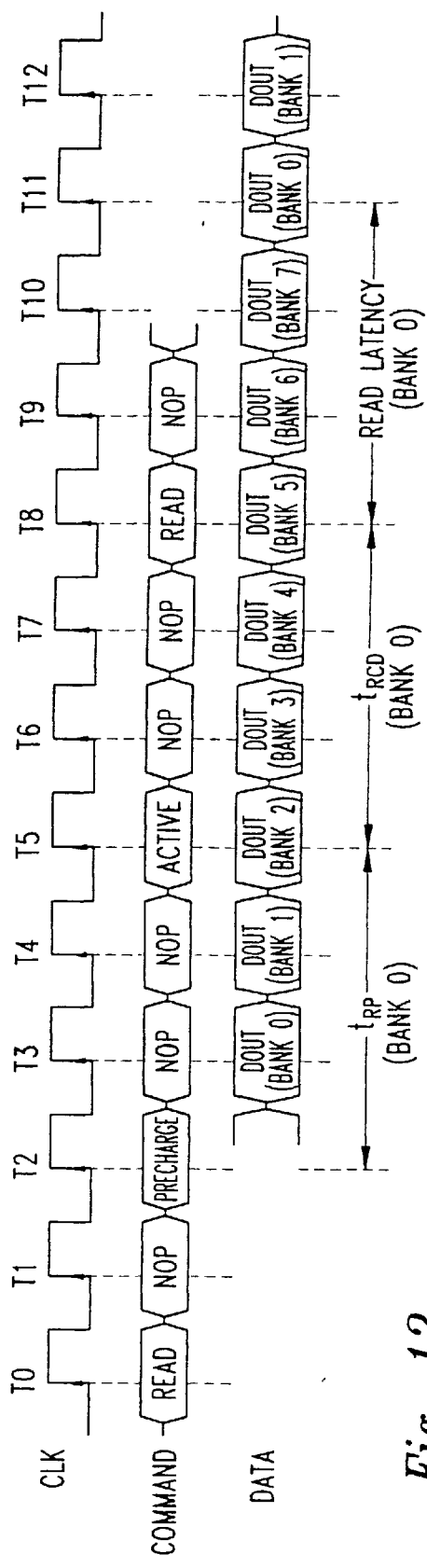
FIG. 12 is a timing diagram showing a transition from a read access in one row of the memory array to a read access in another row of the memory array in the memory device of FIG. 7.
Figure 13:
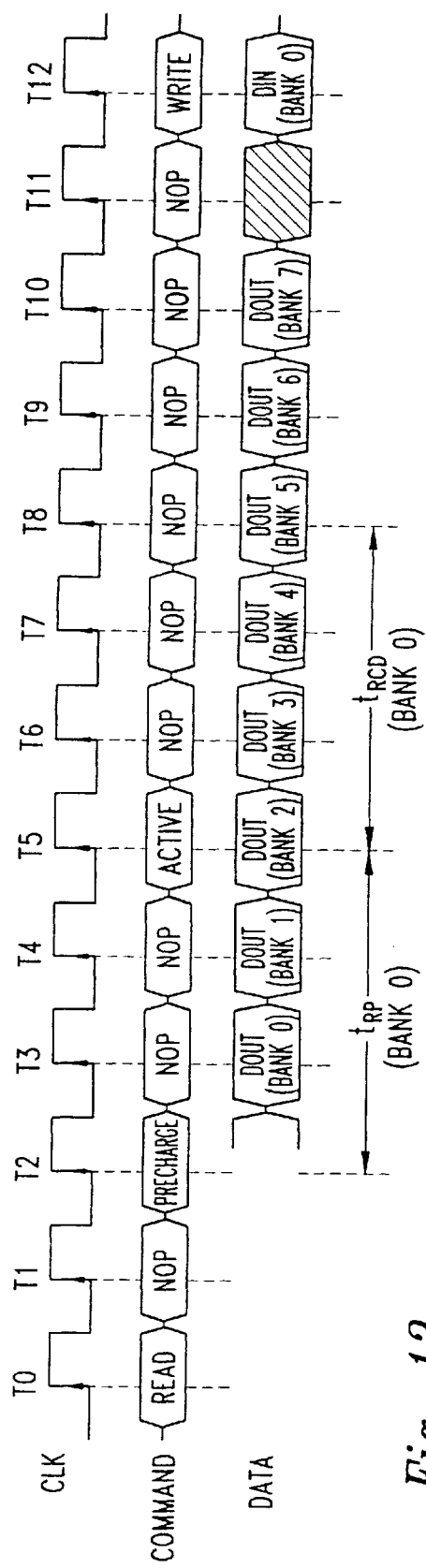
FIG. 13 is a timing diagram showing a transition from a read access in one row of the memory array to a write access in another row of the memory array in the memory device of FIG. 7.
Figure 14:
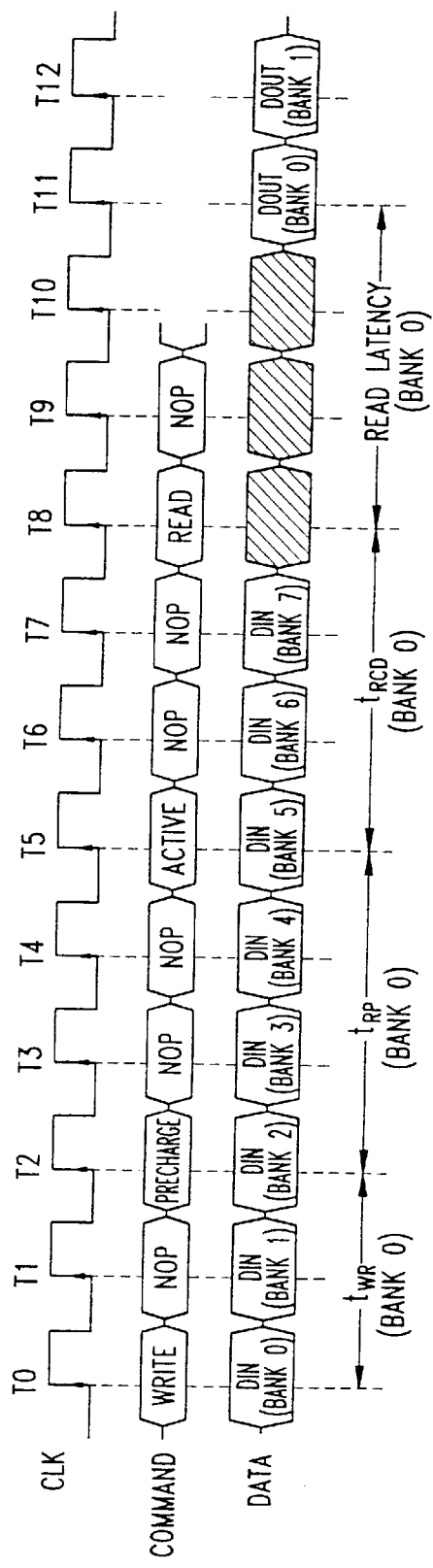
FIG. 14 is a timing diagram showing a transition from a write access in one row of the memory array to a read access in another row of the memory array in the memory device of FIG. 7.
Figure 15:
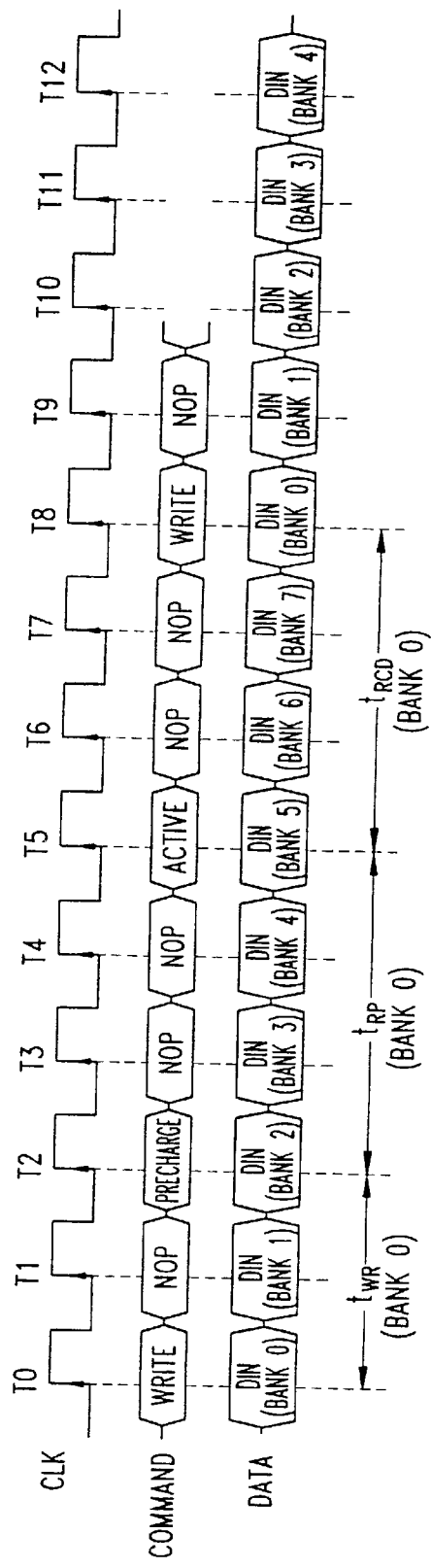
FIG. 15 is a timing diagram showing a transition from a write access in one row of the memory array to a write access in another row of the memory array in the memory device of FIG. 7.

FIGS. 12–15 illustrate the advantages offered by the present invention over those memory devices currently in use. FIG. 12 shows a portion of the sequence shown in FIGS. 8 and 9—namely, a read access to one row being terminated by registration in the memory device 200 of a PRECHARGE command, and the subsequent activation of another row by an ACTIVE command, followed by a READ command. Because of the above-described staggered command sequence to the internally defined banks 220(0)–220(7) of FIG. 7, the data bus is not idle between the last availability of data DOUT(BANK 7) from the one row and the first availability of data DOUT(BANK 0) in the other row. This stands in stark contrast to the idle time of 7 clock cycles, as shown in FIG. 3 and described in the accompanying text. FIG. 13 shows a read access to one row being terminated by a PRECHARGE command, and the subsequent activation of another row by an ACTIVE command, followed by a WRITE command. Here the data bus is shown as idle for one clock cycle between the last availability of data DOUT(BANK 7) from the one row and the first availability of data DIN(BANK 0) for the other row. The data bus is shown as idle here for purposes, if necessary, of turning the data bus around. However, the staggered command sequence of the present invention could provide for no idle time by receiving a WRITE command and first data to be input DIN(BANK 0) one clock cycle earlier than depicted. Currently used devices have the data bus idle for 4 clock cycles, as shown in FIG. 4. FIG. 14 shows the transition from a write access in one row to a read access in another row. Here the data bus is idle for only 3 clock cycles—a significant improvement over the 10 clock cycle idle time of current memory devices, as shown in FIG. 5. Finally, FIG. 15 shows the seamless transition (i.e., no data bus idle time) from a write access in one row to a write access in another row, whereas the current art requires the 7 clock cycle idle time shown in FIG. 6.

Figure 16:
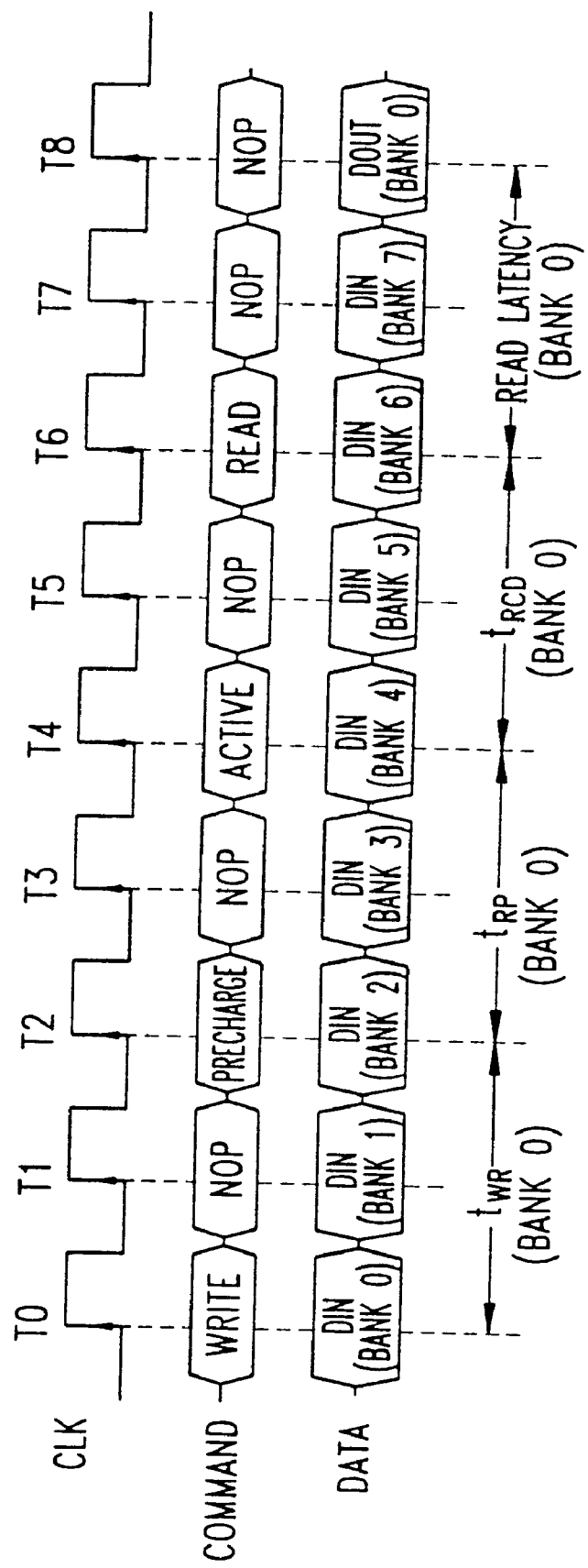
FIG. 16 is a timing diagram showing a seamless transition from a write access in one row of the memory array to a read access in another row of the memory array in the memory device of FIG. 7.

At a clock speed of 100 MHz, the described embodiment according to the present invention still results in some idle time on the data bus during the transition from a write access to one row to a read access to another row. This is because current technology does not provide for memory device precharge times, activation times and read latencies of less than 3 clock cycles at such high operating speeds. FIG. 16 shows how the write-to-read transition could be accomplished seamlessly according to the present invention. (If necessary, provision could be made for one clock cycle idle time to turn the data bus around.) The timing diagram of FIG. 16 shows a precharge time 'RP of 2 clock cycles, an activation time 'RCD of 2 clock cycles, a read latency of 2 clock cycles, and a write recovery time 'WR of 2 clock cycles. Such parameter values are achievable using today's memory device technology at system clock speeds of 66 to 80 MHz. At these clock speeds, it is likely that the write recovery time 'WR can be limited to a single clock cycle, in which case one of the other three parameter limits, such as the precharge time, can be relaxed to 3 clock cycles.

Figure 17:
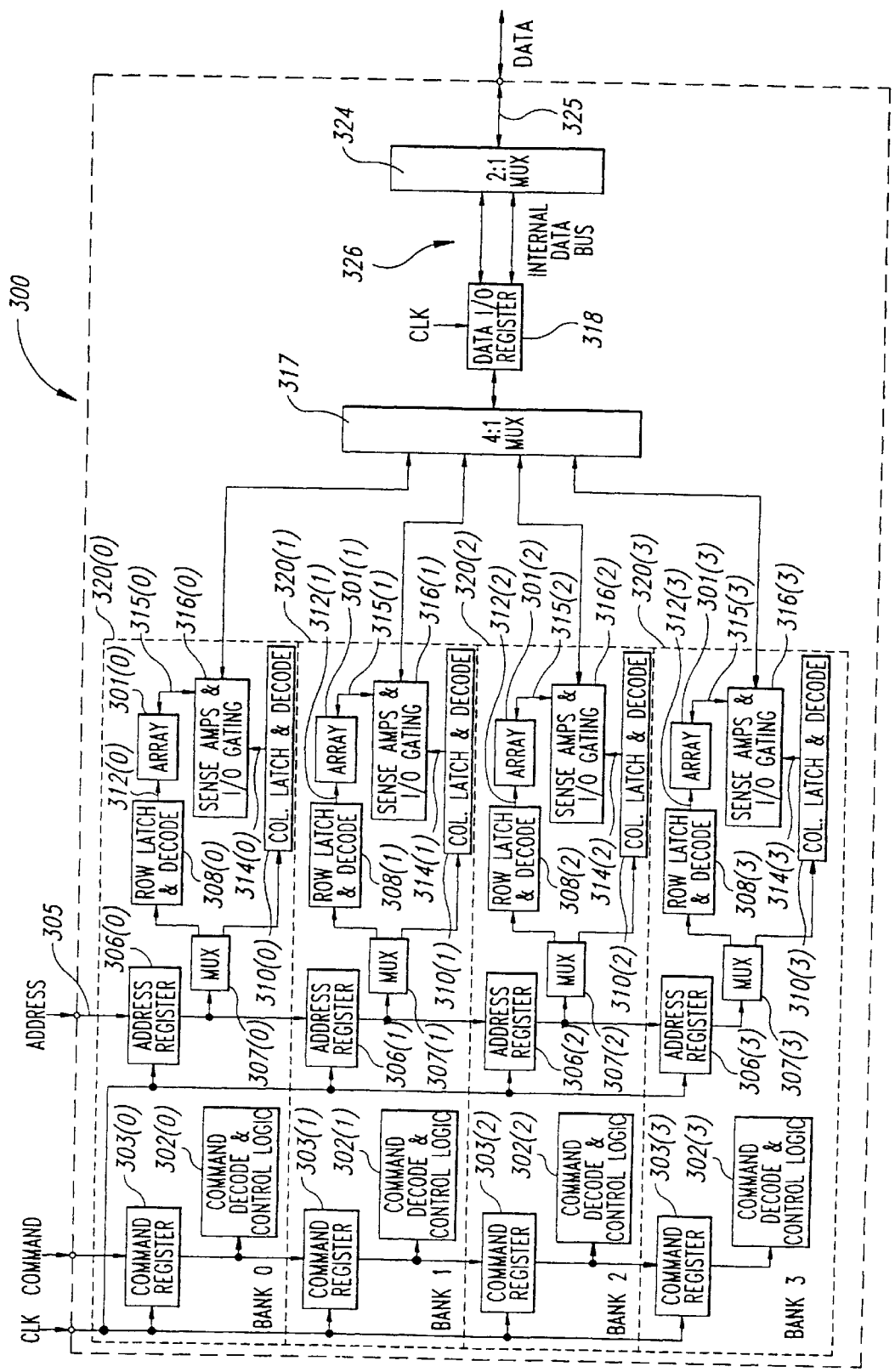
FIG. 17 is a block diagram of an alternate embodiment of the memory device according to the present invention.

Because a four bank architecture may be more attractive from a device fabrication perspective than the above-described eight bank configuration of FIG. 7, an alternative embodiment of the present invention is now described. FIG. 17 shows a memory device 300 having as its central memory element a memory array 301 (collectively 301(0)–301(3) in FIG. 17). The memory array is divided into four memory subarrays 301(0)–301(3), which form part of four defined circuit banks 320(0)–320(3). Like the above-described eight bank configuration, the four bank definition is internal to the memory device 300, and the memory device appears externally to be a single bank device addressable by a processor and/or memory controller solely with a row and column address. As in the eight bank configuration described above, commands applied to the memory device 300 affect all four internal banks 320(0)–320(3) in the same manner, but on a time-staggered basis, as described below and depicted in FIGS. 18–24. In the alternate embodiment, the subarrays 301(0)–301(3) are arranged by 16 bits—meaning that to each specified memory address (paired row and column address) there is a one-to-one correspondence with 16 memory cells in each of the subarrays 301(0)–301(3). Nevertheless, the memory device 300 still has an 8-bit word width, as explained below.

A representative bank 320(j)(j=0, 1, 2 or 3) has substantially the same construction and operation as the above-described representative bank 220(i) of FIG. 7. The system clock (not shown) provides a clock signal CLK to the memory device 300, as well as the processor and/or other addressing circuitry (such as a memory controller) accessing the memory device. Command signals are registered in a command register 303(j) and decoded by a decode and control circuit 302(j). Corresponding to the applied command, the control circuit 302(j) sends control signals on control lines (not shown) to other parts of the bank 320(j), controlling the timing of access to the memory cells in the subarray 301(j).

An address is input on an address bus 305 to an address register 306(j). The address includes a row address and a column address, which are preferably applied to the memory device 300 sequentially. The address register 306(j) sequentially provides the row and column addresses to an address mux 307(j), which in turn provides the row address to a row-address latch and decode circuit 308(j) and the column address to a column-address latch and decode circuit 310(j). In response to one or more control signals (not shown) provided by the control circuit 302(j), the row latch and decode circuit 308(j) takes a row address and activates a corresponding row of memory cells (not shown) in the subarray 301(j) by selecting one of several row access lines 312(j). The row latch and decode circuit 308(j) also operates to deactivate or precharge the activated row in response to one or more control signals (not shown) provided by the control circuit 302(j).

In response to one or more control signals (not shown) provided by the control circuit 302(j), the column latch and decode circuit 310(j) takes a column address and selects a corresponding one of several column access lines 314(j), each of which is coupled to the subarray 301(j) by an I/O interface circuit 316(j). In response to one or more control signals (not shown) provided by the control circuit 302(j), the I/O interface circuit 316(j) selects the memory cells corresponding to the column location in the activated row via bit lines 315(j). The I/O interface circuit 316(j) includes sense amplifiers which determine and amplify the logic state of each of the selected memory cells, and I/O gating of the accessed data to and from a data I/O register 318 via an intermediate mux 317.

The intermediate mux 317 multiplexes 16-bit data elements transferred from/to the four internal banks 320(0)–320(3) and provides/receives the data elements to/from the data register 318. The data register 318 provides/receives two parallel 8-bit data elements on a 16-bit internal data bus 326 to/from a second mux 324 which outputs/inputs the data in successive 8-bit data elements on a data bus 325. Thus, the memory device 300 still functions as an 8-bit word width memory device, with the data bus 325 being connected to an external 8-bit data bus, while having a 16-bit internal data bus 326.

A command supplied by external circuitry (such as a system or memory controller) for registration in the memory device 300 is first registered in command register 303(0) of bank 320(0). Command register 303(0) then provides the command for registration and command register 303(1) of bank 320(1) at a predetermined later time (preferably two clock cycles later). In turn, command register 303(1) provides the command for registration in command register 303(2) of bank 320(2), and so on. Also, row and column address information applied to the memory device 300 is first registered in address register 306(0) of bank 320(0). The address register 306(0) then provides the address information to address register 306(1) of bank 320(0) at the predetermined later time, and so on. Thus, commands and addresses are registered in the banks 320(0)–320(3) in succession at regular time intervals, in a manner similar to that described above in connection with FIGS. 7, 8 and 9.

Figure 22:
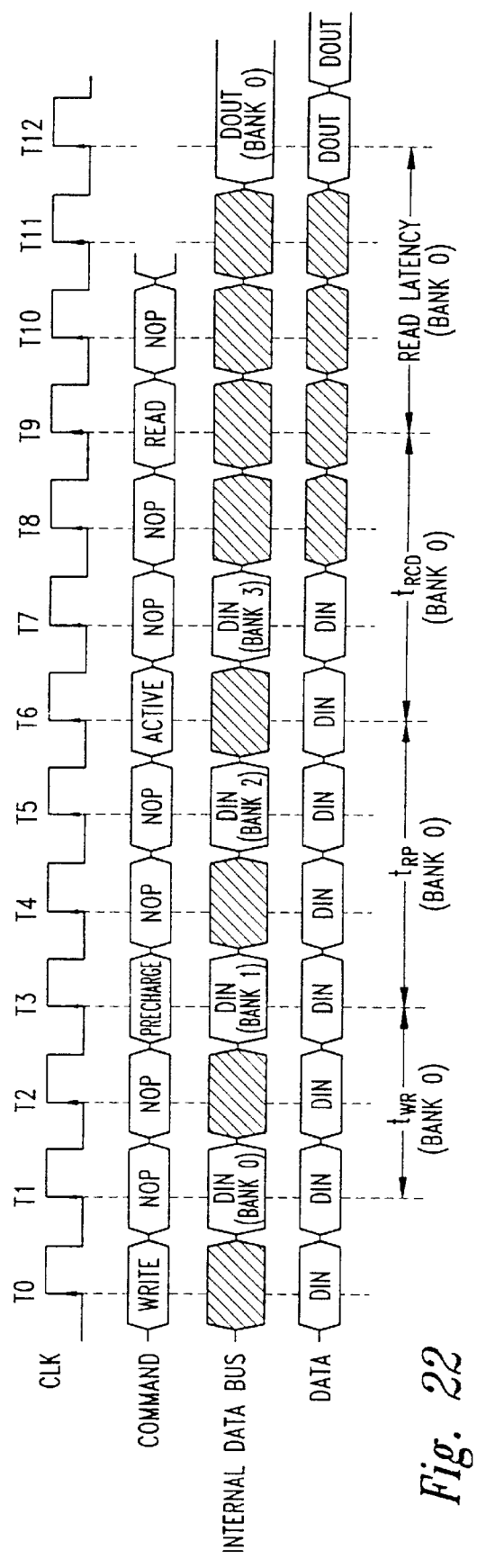
FIG. 22 is a timing diagram showing a transition from a write access in one row of the memory array to a read access in another row of the memory array in the memory device of FIG. 17.
Figure 23:
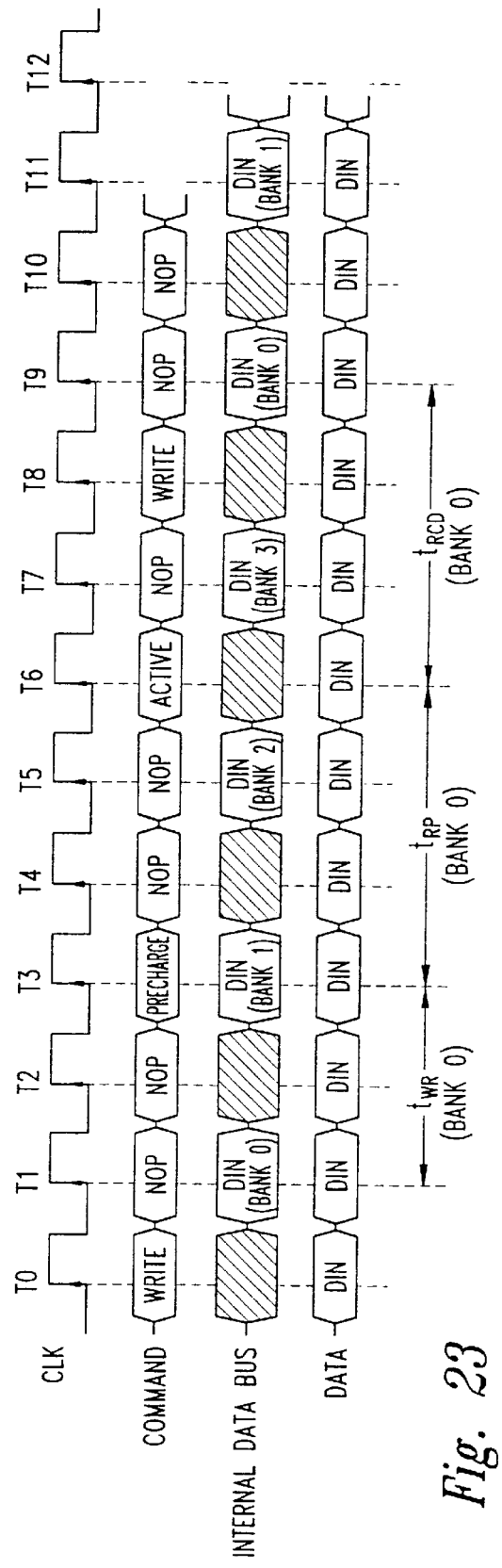
FIG. 23 is a timing diagram showing a transition from a write access in one row of the memory array to a write access in another row of the memory array in the memory device of FIG. 17.
Figure 24:
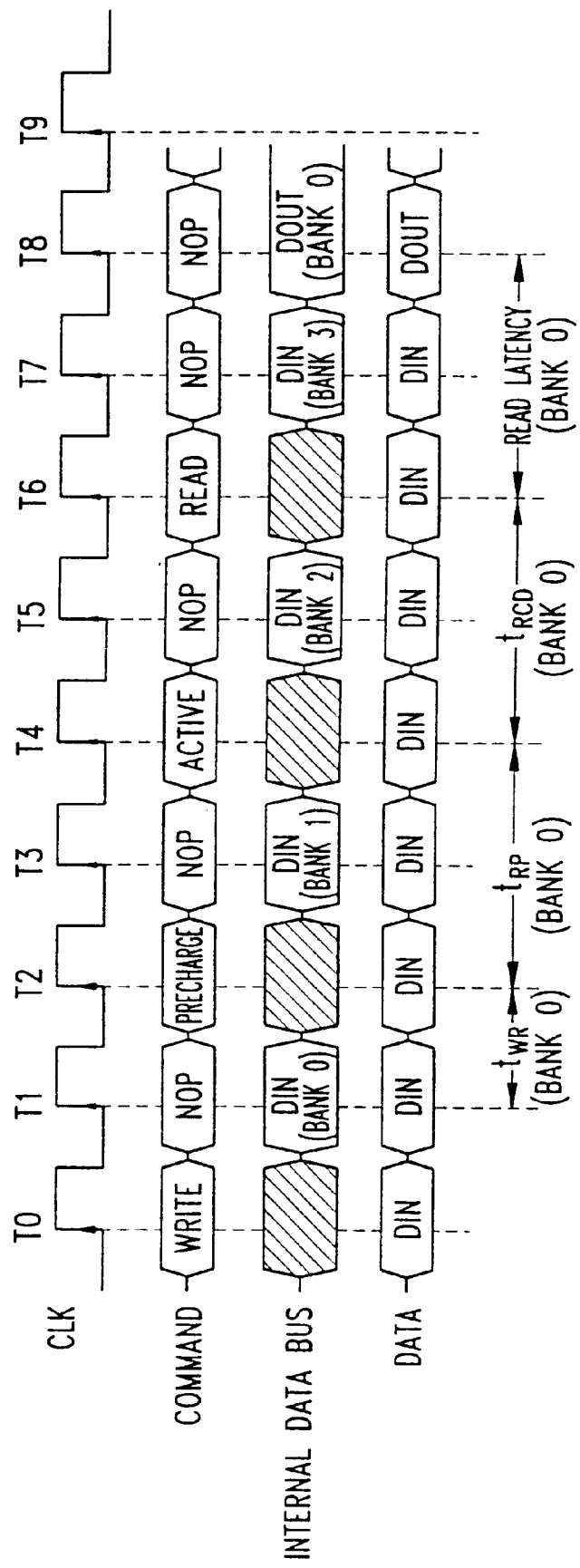
FIG. 24 is a timing diagram showing a seamless transition from a write access in one row of the memory array to a read access in another row of the memory array in the memory device of FIG. 17.

FIGS. 18–24 show the clock signal CLK with leading edges occurring at times T0, T1, T2, etc.; the command supplied to the memory device 300 and registered therein at a time corresponding to a leading edge of the clock signal; the state of the internal data bus 326 (see FIG. 17) on which the 16-bit (two 8-bit) data elements are carried; and the state of the data bus 325 on which data is output (DOUT) from or input (DIN) to the memory device at a time corresponding to a leading edge of the clock signal. The represented parameters in FIGS. 18–23 are the same as in FIGS. 8–15 illustrating the preferred eight bank embodiment, and as in FIGS. 3–6 illustrating currently used memory devices— namely, a clock speed of 100 MHz, a precharge time 'RP of 3 clock cycles, an activation time 'RCD of 3 clock cycles, a write recovery time 'WR of 2 clock cycles, and a read latency of 3 clock cycles. The parameter values shown in FIG. 24 are similar to those depicted in FIG. 16 for the eight bank embodiment and correspond to a lower system clock speed, as described below. In each of FIGS. 18–24, information pertaining to banks 320(0)–320(3) of FIG. 17 is identified by reference to BANK 0–BANK 3, respectively.

Figure 18:
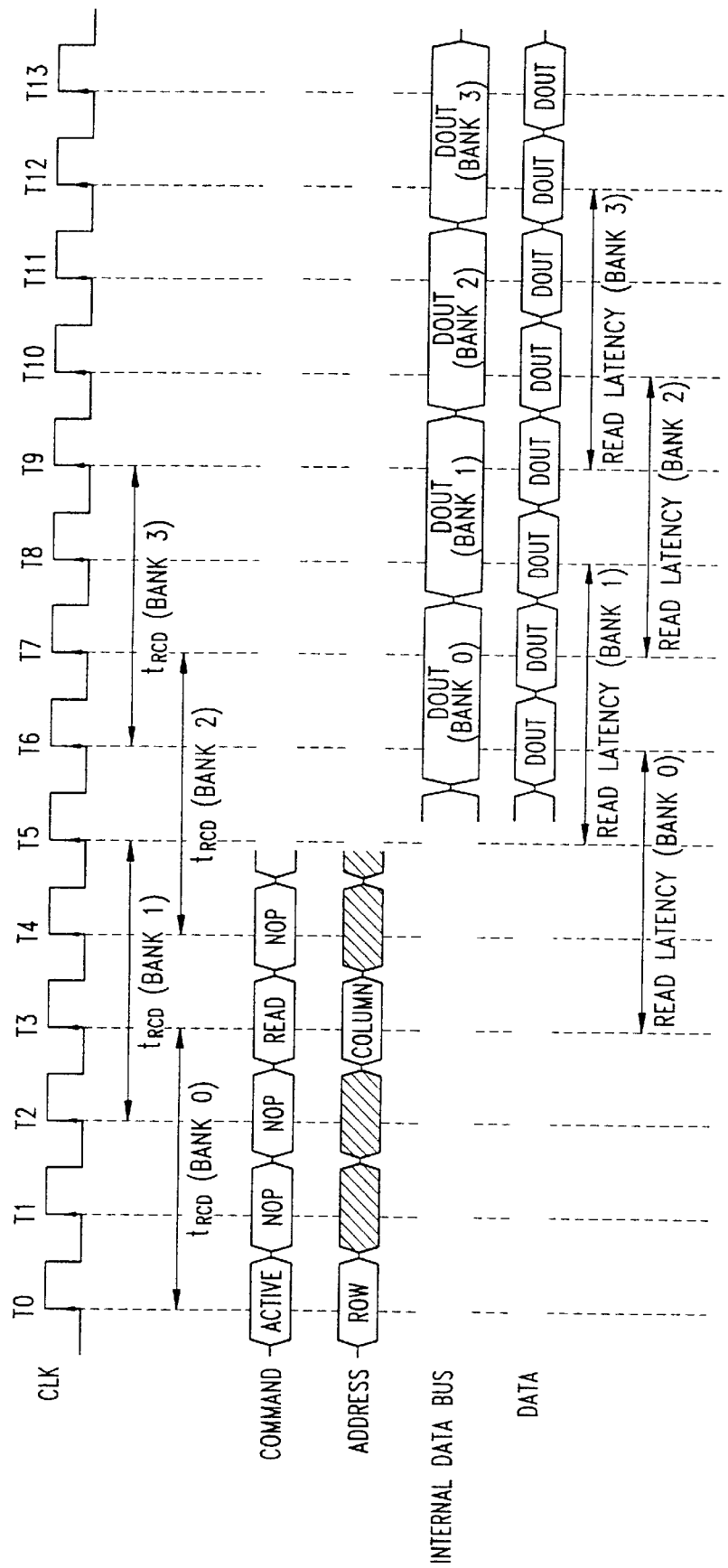
FIG. 18 is a timing diagram showing an activation of a row of a memory array in the memory device of FIG. 17, followed by a read access in the activated row.

FIG. 18 also shows the ROW and COLUMN addresses provided to the memory device 300 on the address bus 305 (see FIG. 17) and registered in the memory device at times corresponding to leading edges of the clock signal. An ACTIVE command and a coincident ROW address are applied to initiate activation of a row at time T0. A row is then activated in each of the four banks 320(0)–320(3) of FIG. 17 on a time-staggered basis. Registration of the ACTIVE command at time T0 initiates activation of the addressed row in BANK 0. Two clock cycles later at clock time T2, activation of the row with the same address is initiated in BANK 1; at time T4, activation of the row with the same address is initiated in BANK 2; and at time T6, activation of the row with the same address is initiated in BANK 3.

As further shown in FIG. 18, a READ command can be registered in the memory device 300 after the activation time limit 'RCD is met for BANK 0 at clock time T3. In other words, the activation time limitation of the memory device 300 appears externally to be just the activation time limitation for BANK 0. A COLUMN address is provided coincident with the READ command, and following the read latency period an internal 16-bit data element from BANK 0 is made available on the data bus 325 of FIG. 17 as two successive 8-bit data elements at times T6 and T7. The READ command and COLUMN address registered in the memory device 300 at time T3 affect the other banks on a time-staggered basis, as does the read latency period, resulting in two successive 8-bit data elements made available on the data bus from each of BANK1, BANK2 and BANK3 at times T8 & T9, T10 & T11, and T12 & T13, respectively.

Figure 19:
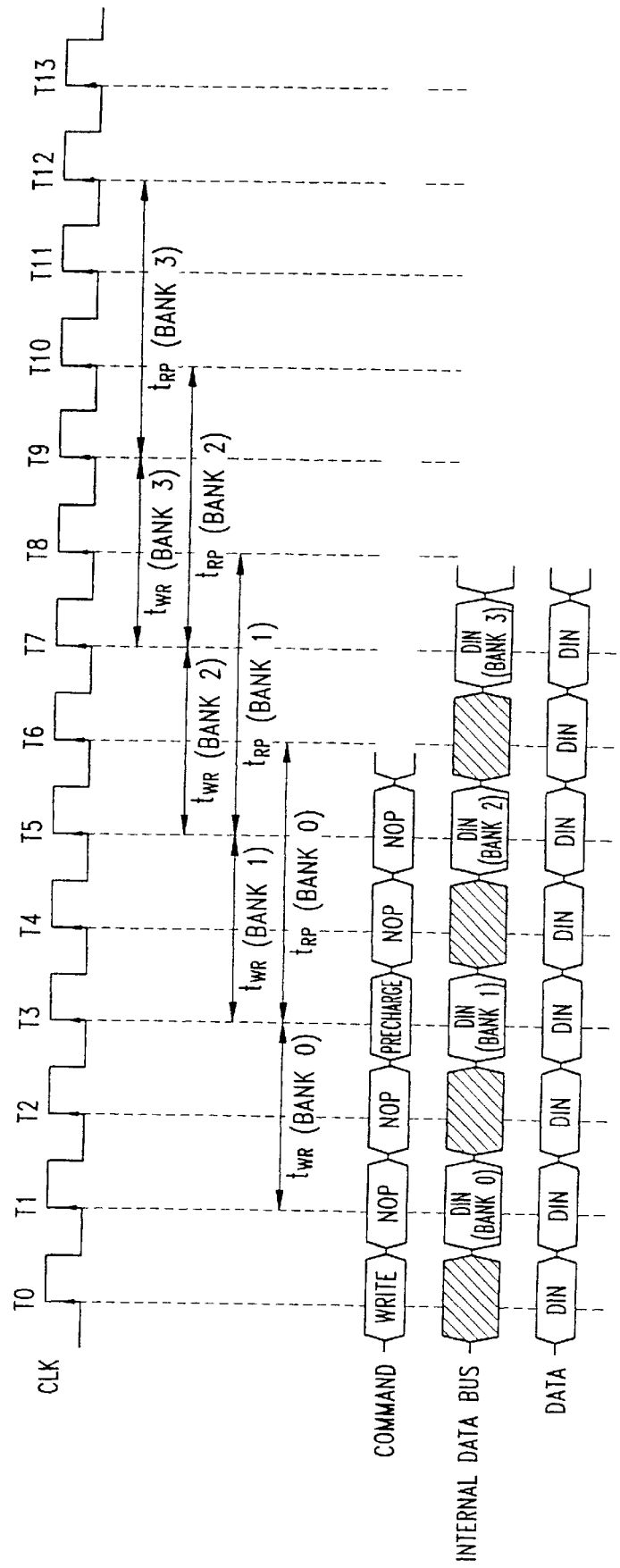
FIG. 19 is a timing diagram showing a write access to a row followed by a command to precharge the row of the memory array in the memory device of FIG. 17.

Similarly, when a PRECHARGE command is registered in the memory device 300, the activated row in each of the banks 320(0)–320(3) of FIG. 17 is deactivated on a staggered basis. FIG. 19 shows a WRITE command as the final access in a row followed by a PRECHARGE command. Externally, the write access to BANK 0 begins a time T0, when the first of two 8-bit data elements is input to the memory device 300 on the data bus 325. At time T1, when the two successive 8-bit data elements have been input to the memory device 300, an internal 16-bit write access to BANK 0 begins. The writing of other data to the other banks occurs similarly on a time-staggered basis. Following the write recovery period 'WR of BANK 0, the memory device 300 can register the PRECHARGE command and deactivate the accessed row in BANK 0. The write recovery time is actually two clock cycles internally, but appears externally to the processor to be three clock cycles by virtue of the time effects of the 2:1 multiplexing. In other words, the write recovery time limitation appears externally to be just the write recovery time limitation for BANK 0 plus one clock cycle. In successive alternating clock cycles, the write accessed rows in the other banks (BANK 1–BANK 3) are each deactivated following the corresponding write recovery periods in those banks.

The results of the staggered or pipe-lined row activation and precharge timing illustrated in FIGS. 18 and 19 is that activation of a subsequently accessed row in the memory subarrays 301(0)–301(3) (see FIG. 17) can be overlapped with the precharge of the currently accessed row. This occurs regardless of the specific row addresses of the currently and subsequently accessed rows, and thereby reduces idle time on the data bus experienced in currently used memory devices.

Figure 20:
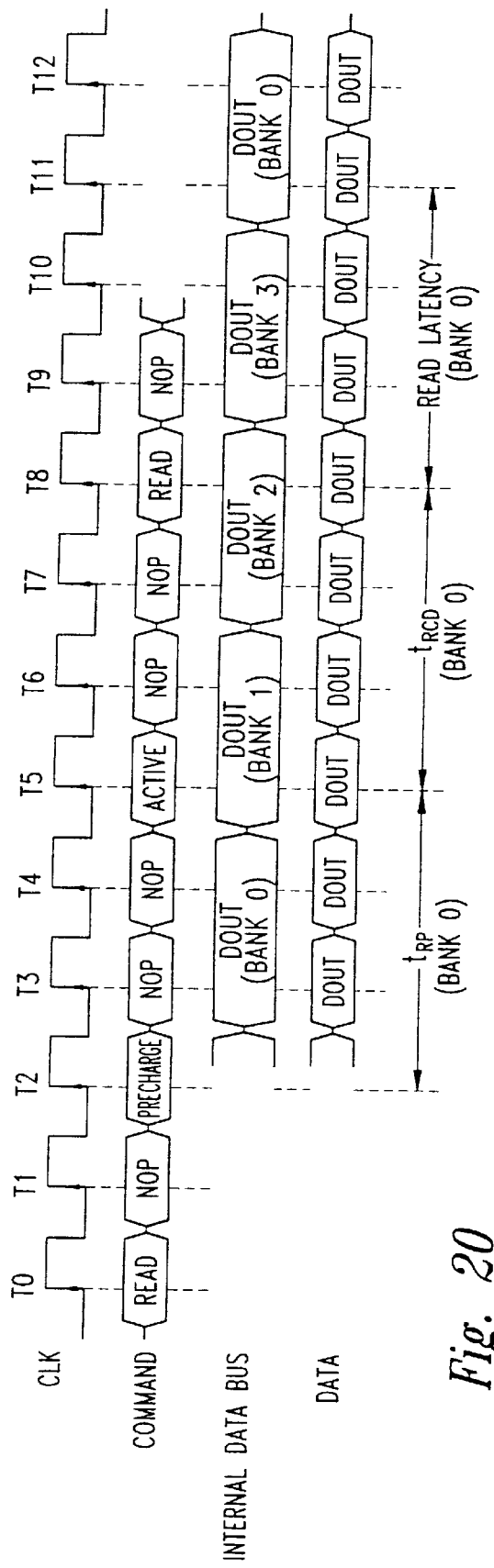
FIG. 20 is a timing diagram showing a transition from a read access in one row of the memory array to a read access in another row of the memory array in the memory device of FIG. 17.
Figure 21:
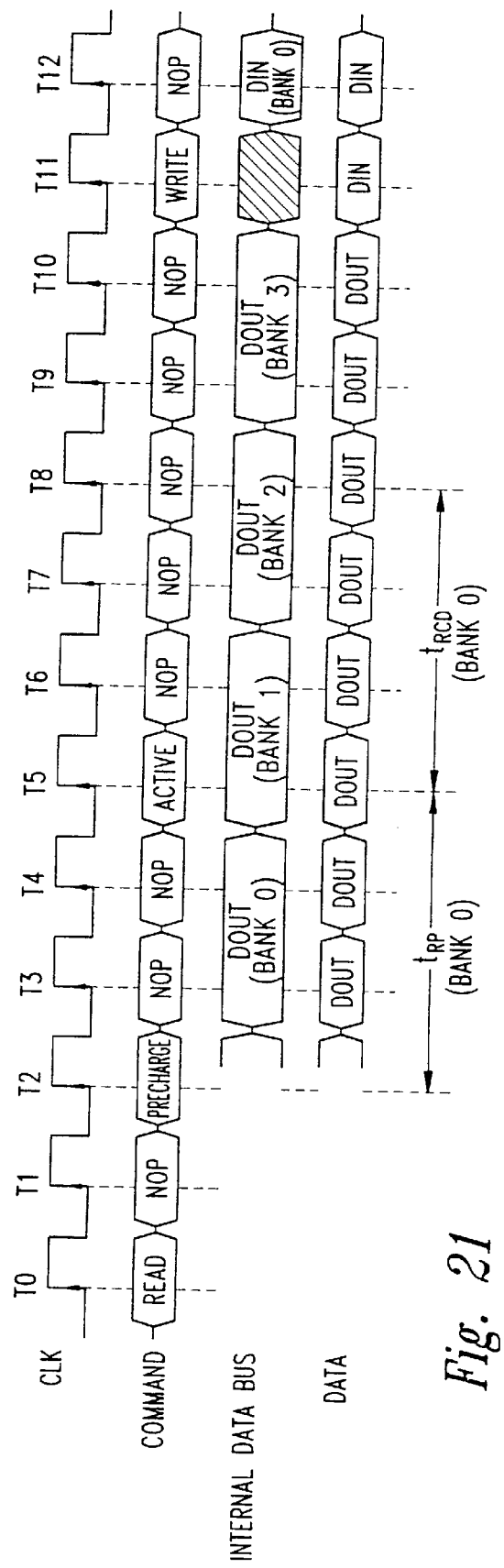
FIG. 21 is a timing diagram showing a transition from a read access in one row of the memory array to a write access in another row of the memory array in the memory device of FIG. 17.

FIGS. 20–23 illustrate the advantages offered by the above-described alternate embodiment of the present invention, as compared to memory devices currently in use. FIG. 20 shows a read access to one row being terminated by registration and execution in the memory device 300 of a PRECHARGE command, and the subsequent activation of another row by an ACTIVE command, followed by a READ command. Because of the above-described staggered command sequence to the internally defined banks 320(0)–320(3) of FIG. 17, the data bus is not idle during the transition from one data transfer cycle to another. This stands in contrast with the currently used memory device idle time of 7 clock cycles, as shown in FIG. 3 and described in the accompanying text. FIG. 21 shows a read access to one row being terminated by a PRECHARGE command, and the subsequent activation of another row by an ACTIVE command, followed by a WRITE command. Here again the data bus is not idle, although provision could be made for one clock cycle idle time to turn the data bus around, if necessary. Currently used devices have the data bus idle for 4 clock cycles, as shown in FIG. 4. FIG. 22 shows the transition from a write access in one row to a read access in another row. Here the data bus is idle for 4 clock cycles—a significant improvement over the 10 clock cycle idle time of current memory devices, as shown in FIG. 5. Finally, FIG. 23 shows a single clock cycle idle time for a transition from a write access in one row to a write access in another row, whereas the current art requires the 7 clock cycle idle time depicted in FIG. 6.

At a clock speed of 100 MHz, the alternate embodiment according to the present invention still results in some idle time on the data bus during the page miss transition from a write access to a read access, and from a write access to a write access. This is because current technology does not provide for memory device precharge times, activation times and read latencies of less than 3 clock cycles at such high operating speeds. FIG. 24 shows how the write-to-read transition could be accomplished seamlessly according to the alternate embodiment of the present invention. (If necessary, provision could be made for one clock cycle idle time to turn the data bus around.) The timing diagram of FIG. 24 shows a precharge time 'RP of 2 clock cycles, an activation time 'RCD of 2 clock cycles, a read latency of 2 clock cycles, and a write recovery time 'WR of 1 clock cycle (appearing externally as 2 clock cycles). Such parameter values are achievable using today's memory device technology at clock speeds of 66 to 80 MHz.

Figure 25:
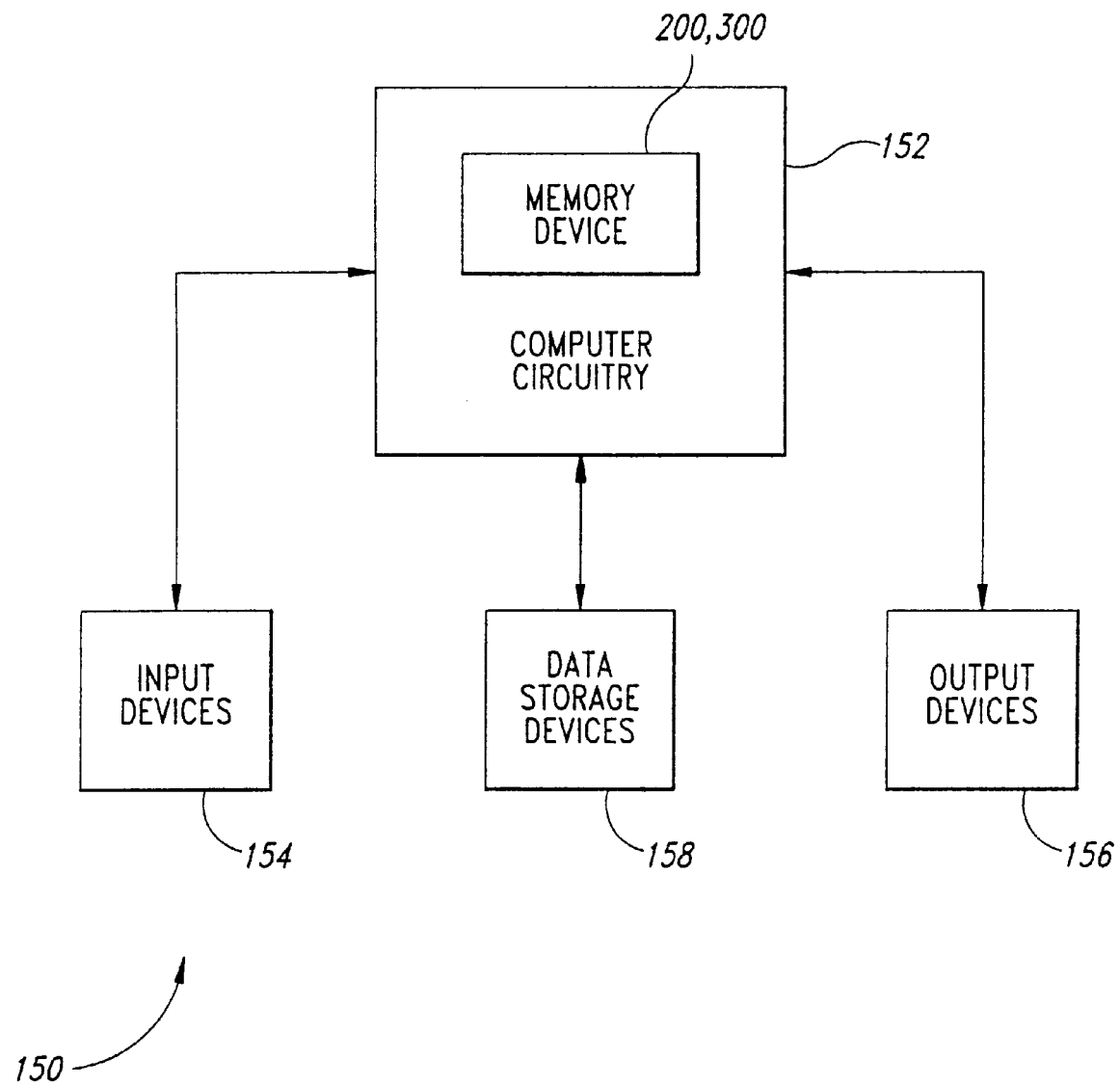
FIG. 25 is a block diagram of a computer system according to the present invention.

FIG. 25 is a block diagram of a computer system 150 that uses the memory device 200, 300 according to the present invention. The computer system 150 includes computer circuitry 152 for performing such computer functions as executing software to perform desired calculations and tasks. Circuitry 152 typically contains a processor (not shown) and the memory device 200 as shown. One or more input devices 154, such as a keyboard or a pointing device, is coupled to the computer circuitry 152 and allows an operator (not shown) to manually input data thereto. One or more output devices 156 is coupled to the computer circuitry 152 to provide data generated by the circuitry to the operator. Examples of output devices 156 include a printer and a video display unit. One or more data storage devices 158 is coupled to the computer circuitry 152 to store data in or retrieve data from external storage media (not shown). Examples of storage devices 158 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. For example, while the present invention has been described as applicable to synchronous DRAMs, the invention can as readily be applied to asynchronous page-oriented DRAMs. Also, the staggered command sequence to multiple internally defined memory array banks can be advantageously applied to many other memory devices, such as static random access memories (SRAMs), or non-volatile memories (especially for read accesses) such as electrically erasable programmable read only memories (EEPROMs).

It will be appreciated that above-described embodiments depicted in FIGS. 7 and 17 are shown in those Figures for purposes of illustration and ease of explanation. Many of the depicted and described separate circuits corresponding to separate circuit banks could be consolidated into a single circuit, such as, for example, a single command register and a single address register servicing all internal banks. Also, for example, one or more parts of the column address latch and decode circuit (210(i) in FIG. 7, 310(j) in FIG. 17) could be combined with one or more parts of the I/O interface circuit (216(i) in FIG. 7, 316(j) in FIG. 17) to from a column select circuit. Similarly, one or more parts of the address register (206(i) in FIG. 7, 306(j) in FIG. 17) and the address mux (207(i) in FIG. 7, 307(j) in FIG. 17) could be combined to form an addressing circuit. Also, one or more parts of the data register (218 in FIG. 7, 318 in FIG. 17) could be combined with one or more parts of the mux unit(s) (217 in FIG. 7, 317 and 324 in FIG. 17) to for a data input circuit and/or a data output circuit. Likewise, one or more parts of the command register (203(i) in FIG. 7, 303(j) in FIG. 17) and the command decode and control logic circuit (202(i) in FIG. 7, 302(j) in FIG. 17) could be combined to form a control circuit. Accordingly, the invention is not limited except as by the appended claims.

We claim:

1. A memory device, comprising:

an array of memory cells operable to store data and arranged in a plurality of subarrays;

an address bus coupled with the array and operable to receive an address applied to the memory device;

a plurality of selection circuits, each coupling a respective one of the subarrays with the address bus, each of the selection circuits operable to receive a selection control signal and to responsively select in the respective subarray a memory cell identified by the address received on the address bus; and a plurality of control circuits, each coupled with a respective one of the selection circuits and providing the selection control signal after a respective one of a plurality of time intervals has elapsed from a selection time.

2. A memory device according to claim 1, further comprising:

a data bus coupled with the array and operable to receive data for storage in the array or to provide data retrieved from the array; and a plurality of data transfer circuits, each coupling a respective one of the subarrays with the data bus, each of the data transfer circuits operable to receive a transfer control signal and responsively transfer data to or from the identified memory cell in the respective subarray, each of the control circuits being coupled with a respective one of the data transfer circuits and providing the transfer control signal after the respective time interval has elapsed from a transfer time.

3. A memory device according to claim 1, further comprising:

a data bus coupled with the array and operable to receive data for storage in the array or to provide data retrieved from the array; and a plurality of data transfer circuits, each coupling a respective one of the subarrays with the data bus, each of the data transfer circuits operable to receive a transfer control signal and responsively transfer data to or from the identified memory cell in the respective subarray, each of the control circuits being coupled with a respective one of the data transfer circuits and providing the transfer control signal after the respective time interval has elapsed from a transfer time, with data being transferred from a first of the subarrays prior to selection of the identified memory cell in a last of the subarrays.

4. A memory device according to claim 1 wherein each of the subarrays has memory cells arranged in rows and columns, and wherein each of the selection circuits comprises:

a row activation circuit operable to receive a row portion of the address and to responsively activate a row of memory cells identified by the row portion of the address; and a column select circuit operable to receive a column portion of the address and to responsively select in the activated row a memory cell identified by the column portion of the address.

5. A memory device according to claim 1 wherein the memory device is adapted to receive a clock signal, and wherein each of the time intervals is substantially equal to an integer multiple of periods of the clock signal.

6. An integrated memory device, comprising:

an array of memory cells operable to store data and arranged in a plurality of subarrays;

an address bus coupled with the array and operable to receive an address applied to the integrated memory device;

a data bus coupled with the array and operable to receive data for storage in the array or to provide data retrieved from the array;

a plurality of selection circuits, each coupling a respective one of the subarrays with the address bus, each of the selection circuits operable to select in the respective subarray a memory cell identified by the address received on the address bus, the identified memory cells being sequentially selected, beginning with selection of the identified memory cell in a first of the subarrays at a selection time; and a plurality of data transfer circuits, each coupling a respective one of the subarrays with the data bus, each of the data transfer circuits operable to transfer data to or from the identified memory cell in the respective subarray, data being transferred to or from the identified memory cells sequentially, beginning with transfer of data to or from the identified memory cell in the first of the subarrays at a transfer time.

7. An integrated memory device according to claim 6 wherein the data is transferred to or from the identified cell in the first of the subarrays prior to the identified cell being selected in a last of the subarrays.

8. An integrated memory device according to claim 6 wherein:

the address is a first address;

the identified memory cell in each of the subarrays is a first identified memory cell in each of the subarrays;

the selection time is a first selection time;

the transfer time is a first transfer time;

each of the selection circuits is operable to select in the respective subarray a second memory cell identified by a second address received on the address bus, the second identified memory cells being sequentially selected, beginning with selection of the second identified memory cell in the first of the subarrays at a second selection time, the second identified memory cell being selected in the first of the subarrays prior to data being transferred to or from the first identified memory cell in a last of the subarrays; and each of the data transfer circuits is operable to transfer data to or from the second identified memory cell in the respective subarray, data being transferred to or from the second identified memory cells sequentially, beginning with transfer of data to or from the second identified memory cell in the first of the subarrays at a second transfer time.

9. An integrated memory device according to claim 6 wherein each of the subarrays has memory cells arranged in rows and columns, and wherein each of the selection circuits comprises:

a row activation circuit operable to receive a row portion of the address and to responsively activate a row of memory cells identified by the row portion of the address; and a column select circuit operable to receive a column portion of the address and to responsively select in the activated row a memory cell identified by the column portion of the address.

10. An integrated memory device according to claim 6 wherein the integrated memory device is adapted to receive a clock signal, and wherein the sequential selection of the identified memory cells occurs at times referenced to the clock signal.

11. An integrated memory device according to claim 6 wherein the integrated memory device is adapted to receive a clock signal, and wherein the sequential data transfer to or from the identified memory cells occurs at times referenced to the clock signal.

12. A computer system, comprising:

a data input device;

a data output device;

a data storage device; and computer circuitry coupled with the data input device, the data output device, and the data storage device, the computer circuitry including a processor coupled with a memory, the memory comprising:

an array of memory cells operable to store data and arranged in a plurality of subarrays;

a plurality of selection circuits, each coupled with a respective one of the subarrays and operable to select therein a memory cell identified by an address received by the memory, the identified memory cells being sequentially selected, beginning with selection of the identified memory cell in a first of the subarrays at a selection time; and a plurality of data transfer circuits, each coupled with a respective one of the subarrays and operable to transfer data to or from the identified memory cell in the respective subarray, data being transferred to or from the identified memory cells sequentially, beginning with transfer of data to or from the identified memory cell in the first of the subarrays at a transfer time.

13. A method of transferring data to or from a memory having an array of memory cells organized in a plurality of subarrays, each subarray having memory cells arranged in rows and columns, the method comprising:

activating a first row identified by a first row address in a first of the subarrays at a first time;

sequentially activating a first row identified by the first row address in each of remaining subarrays;

selecting a first memory cell identified by a first column address in the first row in the first of the subarrays at a second time prior to completing sequentially activating the first row in the remaining subarrays;

sequentially selecting a first memory cell identified by the first column address in the first row in each of the remaining subarrays; and transferring data to or from the first memory cell in the first of the subarrays at a third time prior to completing sequentially selecting the first memory cell in the remaining subarrays.

14. A method according to claim 13 wherein sequentially activating the first row in each of the remaining subarrays comprises activating the first row in each of the remaining subarrays at a respective one of time intervals following the first time, each of the time intervals being substantially equal to a corresponding integer multiple of periods of a clock signal applied to the memory.

15. A method according to claim 13 wherein sequentially selecting the first memory cell in each of the remaining subarrays comprises selecting the first memory cell in each of the remaining subarrays at a respective one of time intervals following the second time, each of the time intervals being substantially equal to a corresponding integer multiple of periods of a clock signal applied to the memory.

16. A method according to claim 13, further comprising:

sequentially transferring data to or from the first memory cell in each of the remaining subarrays; and deactivating the first row in the first of the subarrays at a fourth time prior to completing sequentially transferring data to or from the first memory cell in the remaining subarrays.

17. A method according to claim 16 wherein sequentially transferring data to or from the first memory cell in each of the remaining subarrays comprises transferring data to or from the first memory cell in each of the remaining subarrays at a respective one of time intervals following the third time, each of the time intervals being substantially equal to a corresponding integer multiple of periods of a clock signal applied to the memory.

18. A method according to claim 13 wherein transferring data to or from the first memory cell in the first of the subarrays comprises reading data from the first memory cell in the first of the subarrays.

19. A method according to claim 13 wherein transferring data to or from the first memory cell in the first of the subarrays comprises writing data to the first memory cell in the first of the subarrays.

20. A method according to claim 13, further comprising:

sequentially transferring data to or from the first memory cell in each of the remaining subarrays;

deactivating the first row in the first of the subarrays at a fourth time prior to completing sequentially transferring data to or from the first memory cell in the remaining subarrays;

sequentially deactivating the first row in each of the remaining subarrays;

activating a second row identified by a second row address in the first of the subarrays at a fifth time prior to completing sequentially deactivating the first row in the remaining subarrays;

sequentially activating a second row identified by the second row address in each of the remaining subarrays;

selecting a second memory cell identified by a second column address in the second row in the first of the subarrays at a sixth time prior to completing sequentially activating the second row in the remaining subarrays;

sequentially selecting a second memory cell identified by the second column address in the second row in each of the remaining subarrays; and transferring data to or from the second memory cell in the first of the subarrays at a seventh time prior to completing sequentially selecting the second memory cell in the remaining subarrays.

21. In an integrated memory device having an array of memory cells organized in a plurality of subarrays, a method of transferring data to or from the array, comprising:

selecting a first memory cell identified by a first address in one of the subarrays at a first time;

sequentially selecting a first memory cell identified by the first address in others of the subarrays;

transferring data to or from the first memory cell in the one subarray at a second time prior to completing sequentially selecting the first memory cell in the other subarrays; and sequentially transferring data to or from the first memory cell in the other subarrays.

22. A method according to claim 21 wherein selecting the first memory cell identified by the first address in the one subarray comprises:

selecting a first row of the one subarray, the first row being identified by a row portion of the first address; and selecting a first column of the one subarray, the first column being identified by a column portion of the first address.

23. A method according to claim 21, further comprising:

selecting a second memory cell identified by a second address in the one subarray at a third time prior to completing sequentially transferring data to or from the first memory cell in the other subarrays;

sequentially selecting a second memory cell identified by the second address in the other subarrays;

transferring data to or from the second memory cell in the one subarray at a fourth time prior to completing sequentially selecting the second memory cell in the other subarrays; and sequentially transferring data to or from the second memory cell in the other subarrays.

24. A method according to claim 21 wherein transferring data to or from the first memory cell in the subarrays comprises reading data from the first memory cell in the subarrays.

25. A method according to claim 21 wherein transferring data to or from the first memory cell in the subarrays comprises writing data to the first memory cell in the subarrays.

26. A method according to claim 21 wherein sequentially selecting the first memory cell identified by the first address in the other subarrays comprises selecting the first memory cell identified by the first address in the other subarrays after respective time intervals following the first time, and wherein sequentially transferring data to or from the first memory cell in the other subarrays comprises transferring data to or from the first memory cell in the other subarrays after the respective time intervals following the second time, each of the time intervals being substantially equal to a corresponding integer multiple of periods of a clock signal applied to the integrated memory device.

* * * * *

UNITED STATES PATENT AND TRADEMARK OFFICE
CERTIFICATE OF CORRECTION

PATENT NO. : 5,903,509
DATED : May 11, 1999
INVENTOR(S) : Ryan et al.

It is certified that error appears in the above-indentified patent and that said Letters Patent is hereby corrected as shown below:

Column 2, line 21          reads "latch"          should read - - mux - -

Column 14, line 31         reads "from"         should read - - form - -

Signed and Sealed this

Seventeenth Day of April, 2001

Attest:

NICHOLAS P. GODICI

*Attesting Officer*        *Acting Director of the United States Patent and Trademark Office*